United States Patent
Liao et al.

(10) Patent No.: US 7,494,722 B2
(45) Date of Patent: Feb. 24, 2009

(54) TANDEM OLED HAVING AN ORGANIC INTERMEDIATE CONNECTOR

(75) Inventors: Liang-Sheng Liao, Rochester, NY (US); Wojciech K. Slusarek, Rochester, NY (US); Tukaram K. Hatwar, Penfield, NY (US); Michele L. Ricks, Rochester, NY (US); Dustin L. Comfort, Webster, NY (US)

(73) Assignee: Eastman Kodak Company, Rochester, NJ (US)

( * ) Notice: Subject to any disclaimer, the term of this patent is extended or adjusted under 35 U.S.C. 154(b) by 613 days.

(21) Appl. No.: 11/064,386

(22) Filed: Feb. 23, 2005

(65) Prior Publication Data

US 2006/0188745 A1 Aug. 24, 2006

(51) Int. Cl.
*H01L 51/54* (2006.01)
*H01L 51/52* (2006.01)
*C07D 241/36* (2006.01)

(52) U.S. Cl. .................. 428/690; 428/917; 313/504; 313/506; 257/E51.022; 257/E51.024; 544/343

(58) Field of Classification Search .......... 428/690, 428/917; 427/58, 66; 313/502–509; 257/40, 257/88–103, E51.001–E51.052; 252/301.16–301.35
See application file for complete search history.

(56) References Cited

U.S. PATENT DOCUMENTS

| | | | |
|---|---|---|---|
| 4,500,459 A * | 2/1985 | Hotta et al. | ................. 552/210 |
| 4,769,292 A | 9/1988 | Tang et al. | |
| 4,780,536 A | 10/1988 | Czarnik et al. | |
| 6,107,734 A | 8/2000 | Tanaka et al. | |
| 6,337,492 B1 | 1/2002 | Jones et al. | |
| 6,717,358 B1 | 4/2004 | Liao et al. | |

(Continued)

FOREIGN PATENT DOCUMENTS

EP 1 408 563 4/2004

(Continued)

OTHER PUBLICATIONS

Tatewaki et al., "Molecular-assembly nanostructures of 1:1 mixed Langmuir-Blodgett films of amphiphilic bis-TTF macrocycle and F4-TCNQ," Colloids and Surfaces A: Physicochemical and Engineering Aspects, vol. 284-285, pp. 631-634, Aug. 2006.*

(Continued)

*Primary Examiner*—Callie E Shosho
*Assistant Examiner*—Michael E Nelson
(74) *Attorney, Agent, or Firm*—Raymond L. Owens

(57) ABSTRACT

A tandem OLED includes an anode and a cathode. The OLED also includes at least two electroluminescent units disposed between the anode and the cathode, wherein each of the electroluminescent units includes at least one hole-transporting layer and one organic light-emitting layer. An intermediate connector is disposed between adjacent electroluminescent units, wherein the intermediate connector includes an n-doped organic layer and an electron-accepting layer, the electron-accepting layer being disposed closer to the cathode than the n-doped organic layer, and wherein the electron-accepting layer includes one or more organic materials, each having a reduction potential greater than −0.5 V vs. a Saturated Calomel Electrode, and wherein the one or more organic materials constitute more than 50% by volume of the electron-accepting layer.

11 Claims, 6 Drawing Sheets

U.S. PATENT DOCUMENTS

| | | | |
|---|---|---|---|
| 6,720,573 | B2 | 4/2004 | Son et al. |
| 2002/0158242 | A1 | 10/2002 | Son et al. |
| 2003/0170491 | A1 | 9/2003 | Liao et al. |
| 2003/0189401 | A1* | 10/2003 | Kido et al. .................. 313/504 |
| 2005/0029538 | A1 | 2/2005 | Choi et al. |
| 2005/0029933 | A1 | 2/2005 | Liao et al. |
| 2007/0181887 | A1* | 8/2007 | Kijima et al. .................. 257/79 |

FOREIGN PATENT DOCUMENTS

| | | |
|---|---|---|
| EP | 1 463 130 | 9/2004 |
| JP | 2003045676 A | 2/2003 |

OTHER PUBLICATIONS

Gao et al. "Controlled p-doping of zinc phthalocyanine by coevaporation with tetrafluorotetracyanoquinodimethane: A direct and inverse photoemission study," Applied Physics Letters, vol. 79, No. 24, pp. 4040-4042, Dec. 2001.*

Henning Rost et al., Novel Light-Emitting Poly(arylene vinylene) Copolymer Containing Alternating Phenylene and TPD Units, Proceedings of the SPIE, vol. 3148, Jul. 1997, pp. 373-381, XP-001051675.

Tang et al. "Organic Electroluminescent Diodes", Applied Physics Letters, 51, 913 (1987).

Adachi et al., "Electroluminescence in Organic Films with Three-Layer Structure", Japanese Journal of Applied Physics, 27, L269 (1988).

Tang et al., "Electroluminescence of Doped Organic Thin Films", Journal of Applied Physics, 65, 3610 (1989).

* cited by examiner

US 7,494,722 B2

TANDEM OLED HAVING AN ORGANIC INTERMEDIATE CONNECTOR

CROSS REFERENCE TO RELATED APPLICATIONS

Reference is made to commonly assigned U.S. patent application Ser. No. 10/857,516 filed May 28, 2004 by Liang-Sheng Liao et al., entitled "Tandem OLED Having Stable Intermediate Connectors"; U.S. patent application Ser. No. 10/922,606 filed Aug. 20, 2004 by Liang-Sheng Liao et al., entitled "White OLED Having Multiple White Electroluminescence Units"; U.S. patent application Ser. No. 10/970,928 filed Oct. 22, 2004 by Liang-Sheng Liao et al., entitled "White OLEDs with a Color Compensated Electroluminescent Unit"; and U.S. patent application Ser. No. 11/028,033 filed Jan. 3, 2004 by Liang-Sheng Liao et al., entitled "Tandem OLEDs Having Low Drive Voltage", the disclosures of which are herein incorporated by reference.

FIELD OF INVENTION

The present invention relates to providing a plurality of organic electroluminescent (EL) units to form a tandem organic electroluminescent device having improved EL performance.

BACKGROUND OF THE INVENTION

Organic electroluminescent (EL) devices or organic light-emitting diodes (OLEDs) are electronic devices that emit light in response to an applied potential. The structure of an OLED includes, in sequence, an anode, an organic EL unit, and a cathode. The organic EL unit disposed between the anode and the cathode is commonly comprised of an organic hole-transporting layer (HTL) and an organic electron-transporting layer (ETL). Holes and electrons recombine and emit light in the ETL near the interface of HTL/ETL. Tang et al. "Organic Electroluminescent Diodes", *Applied Physics Letters,* 51,913 (1987), and commonly assigned U.S. Pat. No. 4,769,292 demonstrate highly efficient OLEDs using such a layer structure. Subsequently, numerous OLEDs with alternative layer structures have been disclosed. For example, an OLED can have a three-layer organic EL unit that contains an organic light-emitting layer (LEL) between the HTL and the ETL, designated HTL/LEL/ETL, such as that disclosed by Adachi et al., "Electroluminescence in Organic Films with Three-Layer Structure", *Japanese Journal of Applied Physics,* 27, L269 (1988), and by Tang et al., "Electroluminescence of Doped Organic Thin Films", *Journal of Applied Physics,* 65, 3610 (1989). The LEL commonly includes at least one host material doped with a guest material. Further, there are other multilayer OLEDs that contain more functional layers in the organic EL units. At the same time, many types of EL materials are also synthesized and used in OLEDs. These new device structures and new materials have further resulted in improved device performance.

An OLED is actually a current driven device. Its luminance is proportional to current density, but its lifetime is inversely proportional to current density. In order to achieve high brightness, an OLED has to be operated at a relatively high current density, but this will cause a short operational lifetime. Thus, it is critical to improve the luminous efficiency of an OLED while operating at the lowest possible current density consistent with the intended luminance requirement to increase the lifetime.

In order to dramatically improve luminous efficiency and to increase lifetime in OLED, a tandem OLED (or stacked OLED, or cascaded OLED) structure, can be fabricated by stacking several individual OLEDs vertically and driven by only a single power source. See U.S. Pat. Nos. 6,337,492, 6,107,734, 6,717,358, U.S. Patent Application Publications 2003/0170491 A1, 2003/0189401 A1, and JP Patent Publication 2003045676A. In a tandem OLED having a number of N (N>1) EL units, the luminous efficiency can be N times as high as that of a conventional OLED containing only one EL unit (of course, the drive voltage can also be N times as high as that of the conventional OLED). Therefore, in one aspect to achieve long lifetime, the tandem OLED needs only about 1/N of the current density used in the conventional OLED to obtain the same luminance while the lifetime of the tandem OLED will be about N times that of the conventional OLED. In the other aspect to achieve high luminance, the tandem OLED needs only the same current density used in the conventional OLED to obtain a luminance N times as high as that of the conventional OLED while maintaining about the same lifetime.

In a tandem OLED, all of the EL units are electrically connected in series by inserting an intermediate connector between any adjacent EL units. The intermediate connectors in the tandem OLED play an important role in order to make the tandem OLED useful. The intermediate connectors (or intermediate electrodes) in the prior art tandem OLEDs were mainly formed using metals or other inorganic materials, or combination thereof, such as disclosed in U.S. Pat. Nos. 6,337,492, 6,107,734, and JP Patent Publication 2003045676A. Using a metal or other inorganic material to form an intermediate connector can introduce a fabrication complexity. Many inorganic materials are not easy to deposit by vapor deposition and their deposition methods are sometimes not compatible with the underlying organic layers. In addition, some inorganic materials can cause pixel crosstalk or low optical transparency. Commonly assigned U.S. Patent Application Publication 2003/0170491 A1 and U.S. Pat. No. 6,717,358 teach how to form an intermediate connector (or a connecting unit) by n-type doped organic layer and/or p-type doped organic layer. The doped organic intermediate connector can be formed using only one evaporation method and without causing pixel crosstalk and low optical transparency. Although effective, there is still a need to further improve lifetime, reduce drive voltage and improve manufacturability.

SUMMARY OF THE INVENTION

It is an object of the present invention to make tandem OLEDs with effective EL performance.

This object is achieved by providing a tandem OLED comprising:

a) an anode;

b) a cathode;

c) at least two electroluminescent units disposed between the anode and the cathode, wherein each of the electroluminescent units includes at least one hole-transporting layer and one organic light-emitting layer; and d) an intermediate connector disposed between adjacent electroluminescent units, wherein the intermediate connector includes an n-doped organic layer and an electron-accepting layer, the electron-accepting layer being disposed closer to the cathode than the n-doped organic layer, and wherein the electron-accepting layer includes one or more organic materials, each having a reduction potential greater than −0.5 V vs.

a Saturated Calomel Electrode, and wherein the one or more organic materials constitutes more than 50% by volume of the electron-accepting layer.

The present invention makes use of an organic intermediate connector, which can include nondoped organic materials having the above reduction potential. This facilitates simple fabrication at a low cost.

Preferably, tandem OLEDs are constructed using a plurality of EL units and intermediate connectors, and the devices are driven only using a single power source.

It will be understood that FIGS. 1-5 are not to scale since the individual layers are too thin and the thickness differences of various layers are too great to permit depiction to scale.

DETAILED DESCRIPTION OF THE INVENTION

Figure 1:
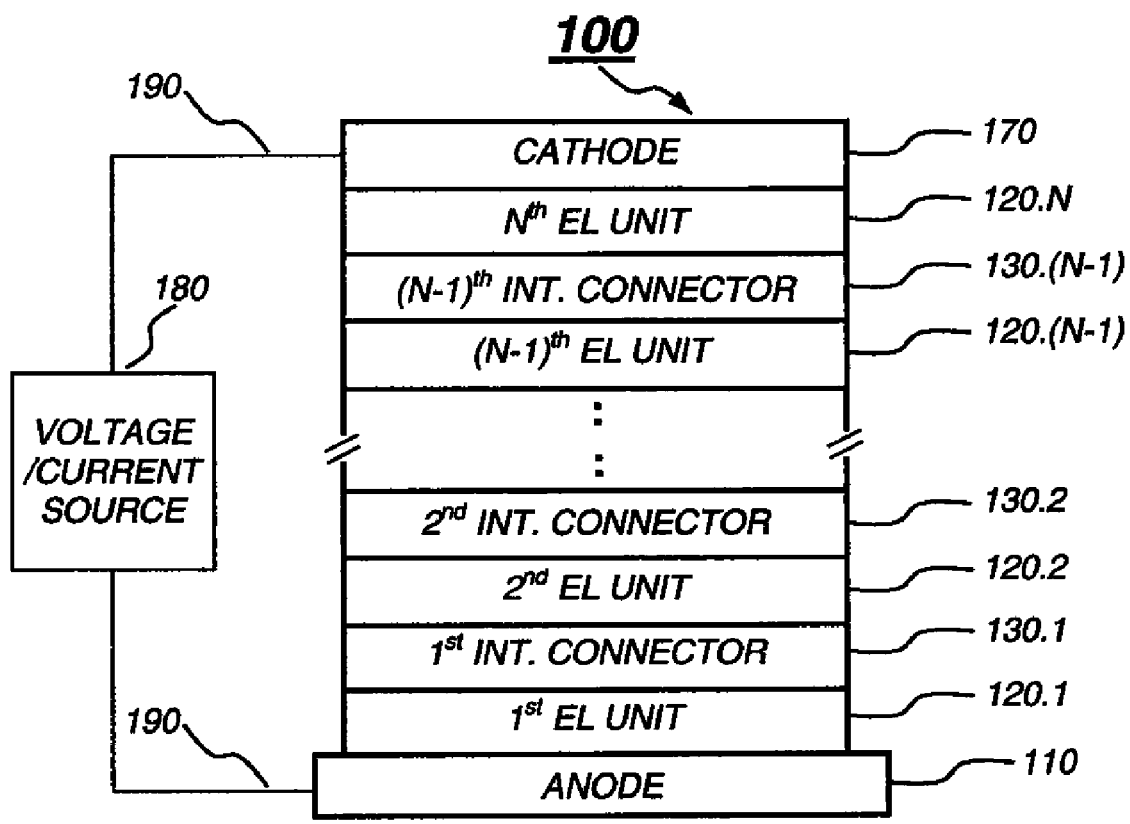
FIG. 1 depicts a schematic cross sectional view of a tandem OLED, having N (N≧1) EL units connected in series by N−1 intermediate connectors, in accordance with the present invention.

FIG. 1 shows a tandem OLED 100 in accordance with the present invention. This tandem OLED has an anode 110 and a cathode 170, at least one of which is transparent. Disposed between the anode and the cathode are N EL units and N−1 intermediate connector (each of them indicated as "int. connector" in the figure), where N is an integer greater than 1. The EL units, stacked and connected serially, are designated 120.1 to 120.N, where 120.1 is the first EL unit (adjacent to the anode), 120.2 is the second EL unit, 120.N−1 is the (N−1)$^{th}$ EL unit, and 120.N is the Nth EL unit (nearby the cathode). The intermediate connectors, disposed between the EL unit, are designated 130.1 to 130.(N−1), where 130.1 is the first intermediate connector disposed between EL units 120.1 and 120.2; 130.2 is the second intermediate connector in contact with EL unit 120.2 and another EL unit (not shown in the figure); and 130.(N−1) is the last intermediate connector disposed between EL units 120.(N−1) and 120.N. The tandem OLED 100 is externally connected to a voltage/current source 180 through electrical conductors 190.

Tandem OLED 100 is operated by applying an electric potential produced by a voltage/current source 180 between a pair of contact electrodes, anode 110 and cathode 170. Under a forward bias of (V×N), this externally applied electrical potential is distributed among the N EL units and the N−1 intermediate connectors. The electric potential (V×N) across the tandem OLED enables the electrons (negatively charged carriers) to have a potential energy of eV×N (relative to the electrical potential of the anode) when they are injected from the cathode into the N$^{th}$ EL unit. In this N$^{th}$ EL unit, those electrons are transporting onto the LUMO of the LEL before a radiative recombination with the holes (positively charged carriers) on the HOMO of the LEL. During the recombination process, the electrons fall down from the LUMO onto the HOMO of the LEL and lose a portion of their potential energy by producing photons. After the 1$^{st}$ radiative recombination, the electrons are continually transporting from the HOMO of the LEL to the HOMO of the HTL, and then are injected into the (N−1)$^{th}$ intermediate connector. The electrons remain a potential energy of about eV×(N−1) when they are injected from the (N−1)$^{th}$ intermediate connector into the (N−1)$^{th}$ EL unit. This "injection-transport-recombination-transport"process happens in each of the EL units before the electrons eventually are injected into the anode. During the energetically cascading "journey" from the cathode to the anode via the N EL units and the (N−1) intermediate connectors, the electrons can have N times of radiative recombinations to produce photons. In other words, each of the injected electrons from the cathode can have a chance to produce N photons.

Figure 2:
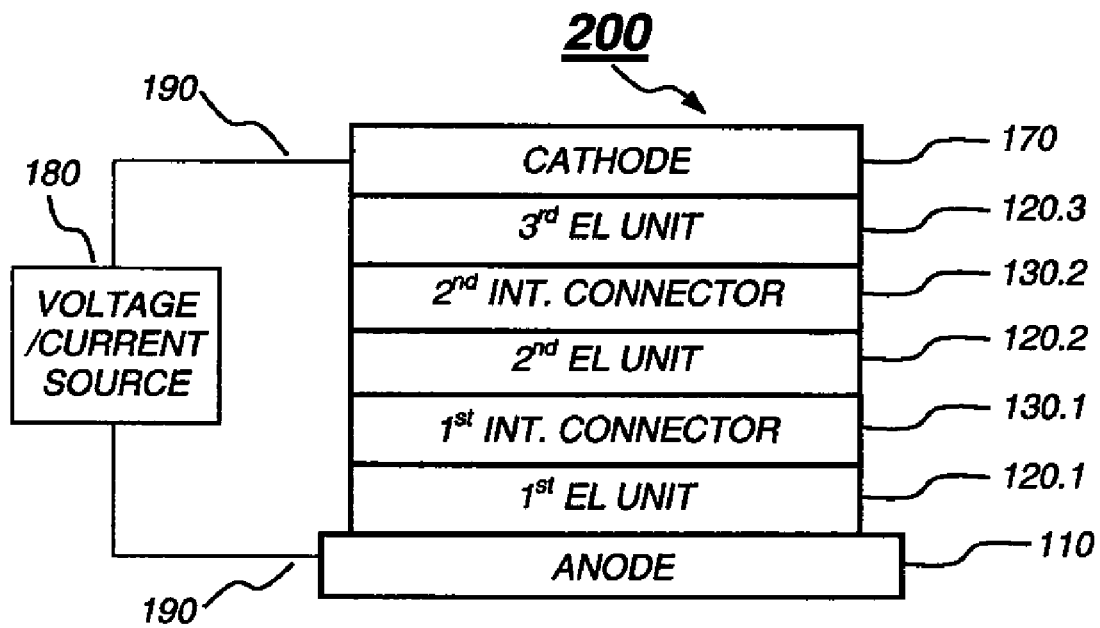
FIG. 2 depicts a schematic cross sectional view of a specific tandem OLED, having three EL units connected in series by two intermediate connector, in accordance with the present invention.

Shown in FIG. 2 is a tandem OLED 200. This tandem OLED has an anode 110 and a cathode 170, at least one of which is transparent. Disposed between the anode and the cathode are three EL units (EL units 120.1, 120.2, and 120.3) and two intermediate connectors (first intermediate connector 130.1 and second intermediate connector 130.2). The tandem OLED 200 is externally connected to a voltage/current source 180 through electrical conductors 190. The tandem OLED 200 is a tandem OLED simplified from FIG. 1.

Each of the EL units in the tandem OLEDs 100 and 200 is capable of supporting hole injection, hole transport, electron injection, electron transport, and electron-hole recombination to produce light. Each of the EL units can comprise a plurality of layers. Such layers can include a hole-injecting layer (HIL), a hole-transporting layer (HTL), a light-emitting layer (LEL), an electron-transporting layer (ETL), an electron-injecting layer (EIL), hole-blocking layer (HBL), electron-blocking layer (EBL), an exciton-blocking layer (XBL), and others known in the art. Various layers can serve multiple functions (e.g., an ETL can also serve as an HBL), and there can be multiple layers that have a similar function (e.g., there can be several LELs, ETLs). There are many organic EL multilayer structures known in the art that can be used as EL units of the present invention. Some nonlimiting examples include, HTL/LEL(s)/ETL, HTL/LEL(s)/EIL, HIL/HTL/LEL(s)/ETL, HIL/HTL/LEL(s)/ETL/EIL, HIL/HTL/EBL or XBL/LEL(s)/ETL/EIL, HIL/HTL/LEL(s)/HBL/ETL/EIL. Each of the EL units in the tandem OLED can have the same or different layer structures from other EL units. Preferably, the layer structure of the EL units is of HTL/LEL(s)/ETL, wherein the EL unit adjacent to the anode has a HIL between the anode and the HTL, and wherein the EL unit adjacent to the cathode has an EIL disposed between the cathode and the ETL. Considering the number of the LELs within a specific EL unit in the tandem OLEDs 100 or 200, the number of LELs in each of the EL units can be changed typically from 1 to 3. Moreover, each of the EL units in the tandem OLED can emit the same or different color.

Figure 3:
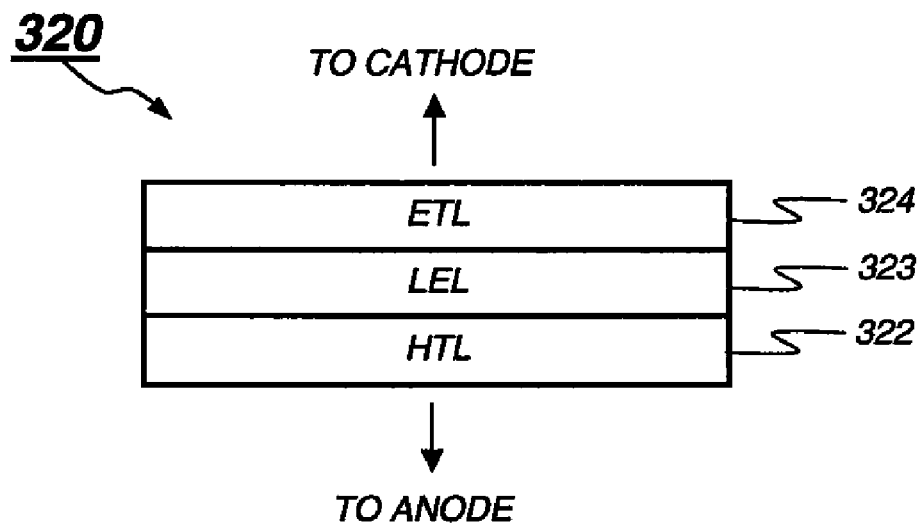
FIG. 3 depicts a schematic cross sectional view of a specific EL unit, having an HTL, a LEL, and an ETL, in accordance with the present invention.

FIG. 3 shows one embodiment of the EL unit structures according to the present invention. EL unit 320 includes HTL 322, LEL 323, and ETL 324.

The HTL 322 in EL unit 320 contains at least one hole-transporting material such as an aromatic tertiary amine, where the aromatic tertiary amine is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. in U.S. Pat. No. 3,180,730. Other suitable triarylamines substituted with one or more vinyl radicals and/or comprising at least one active hydrogen-containing group are disclosed by Brantley et al. in U.S. Pat. Nos. 3,567,450 and 3,658,520.

A more preferred class of aromatic tertiary amines are those which include at least two aromatic tertiary amine moieties as described by VanSlyke et al. in U.S. Pat. Nos. 4,720,432 and 5,061,569. The HTL can be formed of a single or a mixture of aromatic tertiary amine compounds. Illustrative of useful aromatic tertiary amines are the following:

1,1-Bis(4-di-p-tolylaminophenyl)cyclohexane;
1,1-Bis(4-di-p-tolylaminophenyl)-4-phenylcyclohexane;
N,N,N',N'-tetraphenyl-4,4'''-diamino-1,1':4',1'':4'',1'''-quaterphenyl;
Bis(4-dimethylamino-2-methylphenyl)phenylmethane;
1,4-bis[2-[4-[N,N-di(p-toly)amino]phenyl]vinyl]benzene (BDTAPVB);
N,N,N',N'-Tetra-p-tolyl-4,4'-diaminobiphenyl;
N,N,N',N'-Tetraphenyl-4,4'-diaminobiphenyl;
N,N,N',N'-tetra-1-naphthyl-4,4'-diaminobiphenyl;
N,N,N',N'-tetra-2-naphthyl-4,4'-diaminobiphenyl;
N-Phenylcarbazole;
4,4'-Bis[N-(1-naphthyl)-N-phenylamino]biphenyl (NPB);
4,4'-Bis[N-(1-naphthyl)-N-(2-naphthyl)amino]biphenyl (TNB);
4,4'-Bis[N-(1-naphthyl)-N-phenylamino]p-terphenyl;
4,4'-Bis[N-(2-naphthyl)-N-phenylamino]biphenyl;
4,4'-Bis[N-(3-acenaphthenyl)-N-phenylamino]biphenyl;
1,5-Bis[N-(1-naphthyl)-N-phenylamino]naphthalene;
4,4'-Bis[N-(9-anthryl)-N-phenylamino]biphenyl;
4,4'-Bis[N-(1-anthryl)-N-phenylamino]-p-terphenyl;
4,4'-Bis[N-(2-phenanthryl)-N-phenylamino]biphenyl;
4,4'-Bis[N-(8-fluoranthenyl)-N-phenylamino]biphenyl;
4,4'-Bis[N-(2-pyrenyl)-N-phenylamino]biphenyl;
4,4'-Bis[N-(2-naphthacenyl)-N-phenylamino]biphenyl;
4,4'-Bis[N-(2-perylenyl)-N-phenylamino]biphenyl;
4,4'-Bis[N-(1-coronenyl)-N-phenylamino]biphenyl;
2,6-Bis(di-p-tolylamino)naphthalene;
2,6-Bis[di-(1-naphthyl)amino]naphthalene;
2,6-Bis[N-(1-naphthyl)-N-(2-naphthyl)amino]naphthalene;
N,N,N',N'-Tetra(2-naphthyl)-4,4''-diamino-p-terphenyl;
4,4'-Bis{N-phenyl-N-[4-(1-naphthyl)-phenyl]amino}biphenyl;
2,6-Bis[N,N-di(2-naphthyl)amino]fluorene;
4,4',4''-tris[(3-methylphenyl)phenylamino]triphenylamine (MTDATA); and
4,4'-Bis[N-(3-methylphenyl)-N-phenylamino]biphenyl (TPD).

Another class of useful hole-transporting materials includes polycyclic aromatic compounds as described in EP 1 009 041. Tertiary aromatic amines with more than two amino groups can be used including oligomeric materials. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

LEL 323 includes a luminescent fluorescent or phosphorescent material where electroluminescence is produced as a result of electron-hole pair recombination in this region. The light-emitting layer can be comprised of a single material, but more commonly contains a host material doped with a guest emitting material or materials where light emission comes primarily from the emitting materials and can be of any color. This guest emitting material is often referred to as a light-emitting dopant. The host materials in the light-emitting layer can be an electron-transporting material, as defined below, a hole-transporting material, as defined above, or another material or combination of materials that support hole-electron recombination. The emitting material is typically chosen from highly fluorescent dyes and phosphorescent compounds, e.g., transition metal complexes as described in WO 98/55561, WO 00/18851, WO 00/57676, and WO 00/70655. Emitting materials are typically incorporated at 0.01 to 10% by weight of the host material.

The host and emitting materials can be small nonpolymeric molecules or polymeric materials including polyfluorenes and polyvinylarylenes, e.g., poly(p-phenylenevinylene), PPV. In the case of polymers, small molecule emitting materials can be molecularly dispersed into a polymeric host, or the emitting materials can be added by copolymerizing a minor constituent into a host polymer.

An important relationship for choosing an emitting material is a comparison of the bandgap potential which is defined as the energy difference between the highest occupied molecular orbital and the lowest unoccupied molecular orbital of the molecule. For efficient energy transfer from the host to the emitting material, a necessary condition is that the band gap of the dopant is smaller than that of the host material. For phosphorescent emitters (including materials that emit from a triplet excited state, i.e., so-called "triplet emitters") it is also important that the host triplet energy level of the host be high enough to enable energy transfer from host to emitting material.

Host and emitting materials known to be of use include, but are not limited to, those disclosed in U.S. Pat. Nos. 4,768,292, 5,141,671, 5,150,006, 5,151,629, 5,405,709, 5,484,922, 5,593,788, 5,645,948, 5,683,823, 5,755,999, 5,928,802, 5,935,720, 5,935,721, 6,020,078, 6,475,648, 6,534,199, 6,661,023, U.S. Patent Application Publications 2002/0127427 A1, 2003/0198829 A1, 2003/0203234 A1, 2003/0224202 A1, and 2004/0001969 A1.

Metal complexes of 8-hydroxyquinoline (oxine) and similar derivatives constitute one class of useful host compounds capable of supporting electroluminescence. Illustrative of useful chelated oxinoid compounds are the following:

CO-1: Aluminum trisoxine [alias, tris(8-quinolinolato)aluminum(III)];
CO-2: Magnesium bisoxine [alias, bis(8-quinolinolato)magnesium(II)];
CO-3: Bis[benzo{f}-8-quinolinolato]zinc (II);
CO-4: Bis(2-methyl-8-quinolinolato)aluminum(III)-μ-oxo-bis(2-methyl-8-quinolinolato) aluminum(III);
CO-5: Indium trisoxine [alias, tris(8-quinolinolato)indium];
CO-6: Aluminum tris(5-methyloxine) [alias, tris(5-methyl-8-quinolinolato) aluminum(III)];
CO-7: Lithium oxine [alias, (8-quinolinolato)lithium(I)];

CO-8: Gallium oxine [alias, tris(8-quinolinolato)gallium (III)]; and

CO-9: Zirconium oxine [alias, tetra(8-quinolinolato)zirconium(IV)].

Another class of useful host materials includes derivatives of anthracene, such as those described in U.S. Pat. Nos. 5,935,721, 5,972,247, 6,465,115, 6,534,199, 6,713,192, U.S. Patent Application Publications 2002/0048687 A1, 2003/0072966 A1, and WO 2004/018587 A1. Some examples include derivatives of 9,10-dinaphthylanthracene derivatives and 9-naphthyl-10-phenylanthracene. Other useful classes of host materials include distyrylarylene derivatives as described in U.S. Pat. No. 5,121,029, and benzazole derivatives, for example, 2,2',2"-(1,3,5-phenylene)tris[1-phenyl-1H-benzimidazole].

Desirable host materials are capable of forming a continuous film. The light-emitting layer can contain more than one host material in order to improve the device's film morphology, electrical properties, light emission efficiency, and lifetime. Mixtures of electron-transporting and hole-transporting materials are known as useful hosts. In addition, mixtures of the above listed host materials with hole-transporting or electron-transporting materials can make suitable hosts.

Useful fluorescent dopants include, but are not limited to, derivatives of anthracene, tetracene, xanthene, perylene, rubrene, coumarin, rhodamine, and quinacridone, dicyanomethylenepyran compounds, thiopyran compounds, polymethine compounds, pyrylium and thiapyrilium compounds, fluorene derivatives, periflanthene derivatives, indenoperylene derivatives, bis(azinyl)amine boron compounds, bis(azinyl)methane boron compounds, derivatives of distryrylbenzene and distyrylbiphenyl, and carbostyryl compounds. Among derivatives of distyrylbenzene, particularly useful are those substituted with diarylamino groups, informally known as distyrylamines.

Suitable host materials for phosphorescent emitters (including materials that emit from a triplet excited state, i.e., so-called "triplet emitters") should be selected so that the triplet exciton can be transferred efficiently from the host material to the phosphorescent material. For this transfer to occur, it is a highly desirable condition that the excited state energy of the phosphorescent material be lower than the difference in energy between the lowest triplet state and the ground state of the host. However, the band gap of the host should not be chosen so large as to cause an unacceptable increase in the drive voltage of the OLED. Suitable host materials are described in WO 00/70655 A2, WO 01/39234 A2, WO 01/93642 A1, WO 02/074015 A2, WO 02/15645 A1, and U.S. Patent Application Publication 2002/0117662 A1. Suitable hosts include certain aryl amines, triazoles, indoles and carbazole compounds. Examples of desirable hosts are 4,4'-N,N'-dicarbazole-biphenyl (CBP), 2,2'-dimethyl-4,4'-N,N'-dicarbazole-biphenyl, m-(N,N'-dicarbazole)benzene, and poly(N-vinylcarbazole), including their derivatives.

Examples of useful phosphorescent materials that can be used in light-emitting layers of this invention include, but are not limited to, those described in WO 00/57676 A1, WO 00/70655 A1, WO 01/41512 A1, WO 02/15645 A1, WO 01/93642A1, WO 01/39234 A2, WO 02/074015 A2, WO 02/071813 A1, U.S. Pat. Nos. 6,458,475, 6,573,651, 6,451,455, 6,413,656, 6,515,298, 6,451,415, 6,097,147, U.S. Patent Application Publications 2003/0017361 A1, 2002/0197511 A1, 2003/0072964 A1, 2003/0068528 A1, 2003/0124381 A1, 2003/0059646 A1, 2003/0054198 A1, 2002/0100906 A1, 2003/0068526 A1, 2003/0068535 A1, 2003/0141809 A1, 2003/0040627 A1, 2002/0121638 A1, EP 1 239 526 A2, EP 1 238 981 A2, EP 1 244 155 A2, JP 2003073387A, JP 2003073388A, JP 2003059667A, and JP 2003073665A. Useful phosphorescent dopants include, but are not limited to, transition metal complexes, such as iridium and platinum complexes.

In some cases it is useful for one or more of the LELs within an EL unit to emit broadband light, for example white light. Multiple dopants can be added to one or more layers in order to produce a white-emitting OLED, for example, by combining blue- and yellow-emitting materials, cyan- and red-emitting materials, or red-, green-, and blue-emitting materials. White-emitting devices are described, for example, in EP 1 187 235, EP 1 182 244, U.S. Pat. Nos. 5,683,823, 5,503,910, 5,405,709, 5,283,182, 6,627,333, 6,696,177, 6,720,092, U.S. Patent Application Publications 2002/0186214 A1, 2002/0025419 A1, and 2004/0009367 A1. In some of these systems, the host for one light-emitting layer is a hole-transporting material.

The ETL 324 in EL unit 320 can contain one or more metal chelated oxinoid compounds, including chelates of oxine itself, also commonly referred to as 8-quinolinol or 8-hydroxyquinoline. Such compounds help to inject and transport electrons, exhibit high levels of performance, and are readily deposited to form thin films. Exemplary oxinoid compounds have been listed above from CO-1 to CO-9. (The oxinoid compounds can be used as both the host material in LEL 323 and the electron-transporting material in ETL 324).

Other electron-transporting materials include various butadiene derivatives as disclosed in U.S. Pat. No. 4,356,429 and various heterocyclic optical brighteners as described in U.S. Pat. No. 4,539,507. Benzazoles, oxadiazoles, triazoles, pyridinethiadiazoles, triazines, phenanthroline derivatives, and some silole derivatives are also useful electron-transporting materials.

Each of the layers in the EL unit 320 can be formed from small molecule OLED materials, or polymeric LED materials, or combinations thereof. Some EL units can be polymeric and other units can be of small molecules (or nonpolymeric), including fluorescent materials and phosphorescent materials. The corresponding layer in each of the EL units in the tandem OLED can be formed using the same or different materials from those of the other corresponding layers, and can have the same or different layer thicknesses.

For a tandem OLED to function efficiently, the intermediate connector should provide effective carrier injection into the adjacent EL units. It is also preferred that the optical transparency of the layers constituting the intermediate connector should be as high as possible to permit for radiation produced in the EL units to exit the device.

Figure 4A:
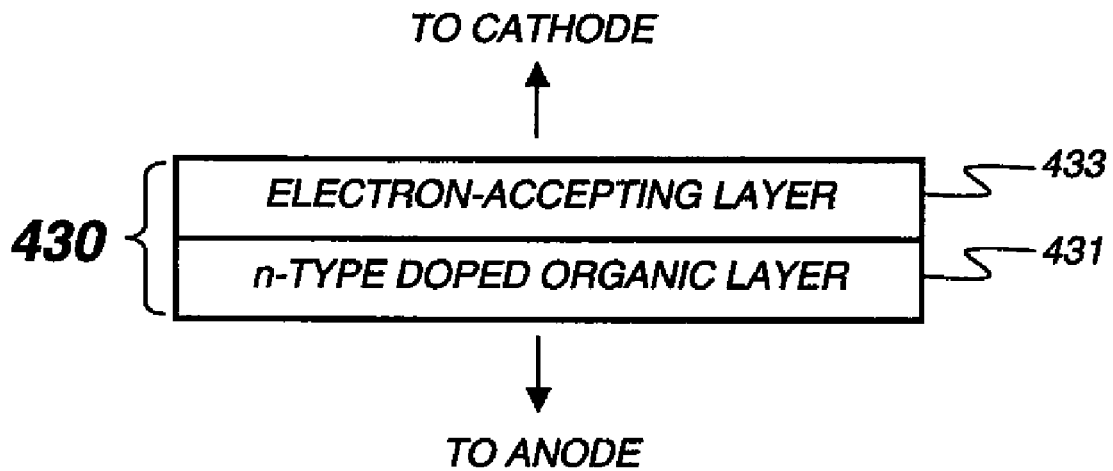
FIG. 4A depicts a schematic cross sectional view of an organic intermediate connector in the tandem OLED in one embodiment of the present invention.
Figure 4B:
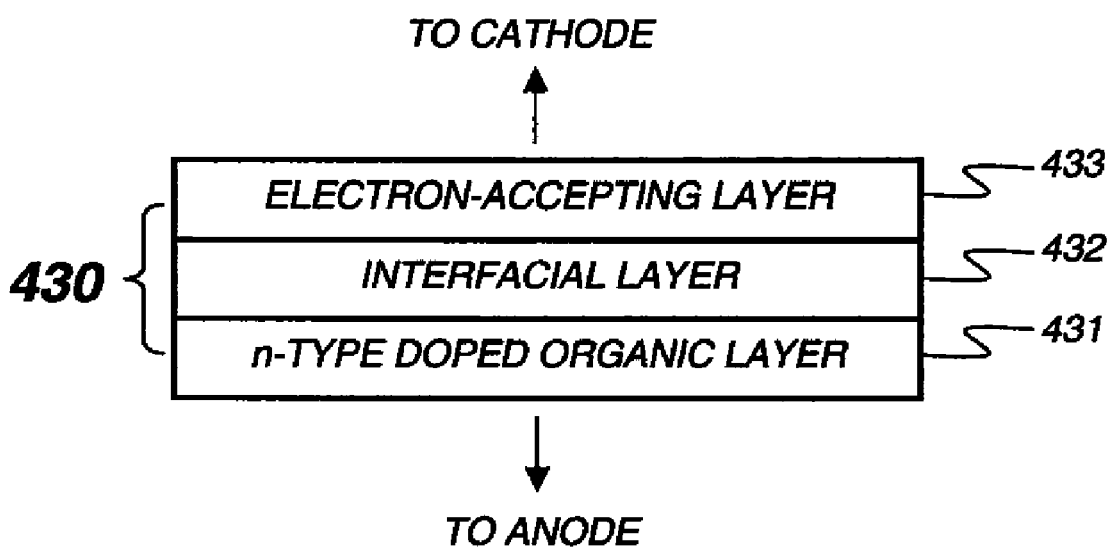
FIG. 4B depicts a schematic cross sectional view of an organic intermediate connector in the tandem OLED in another embodiment of the present invention.
Figure 4C:
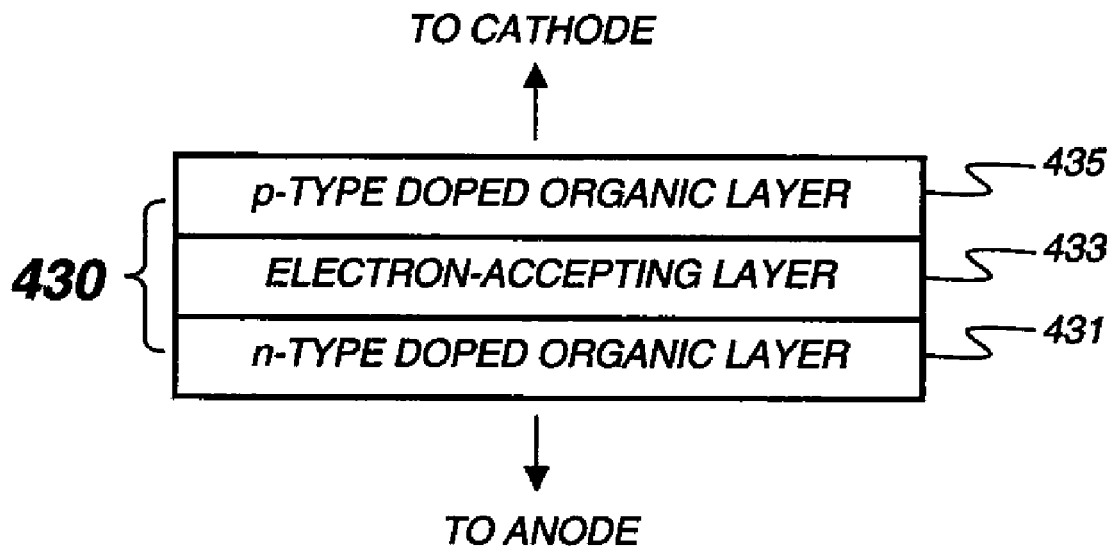
FIG. 4C depicts a schematic cross sectional view of an organic intermediate connector in the tandem OLED in another embodiment of the present invention.
Figure 4D:
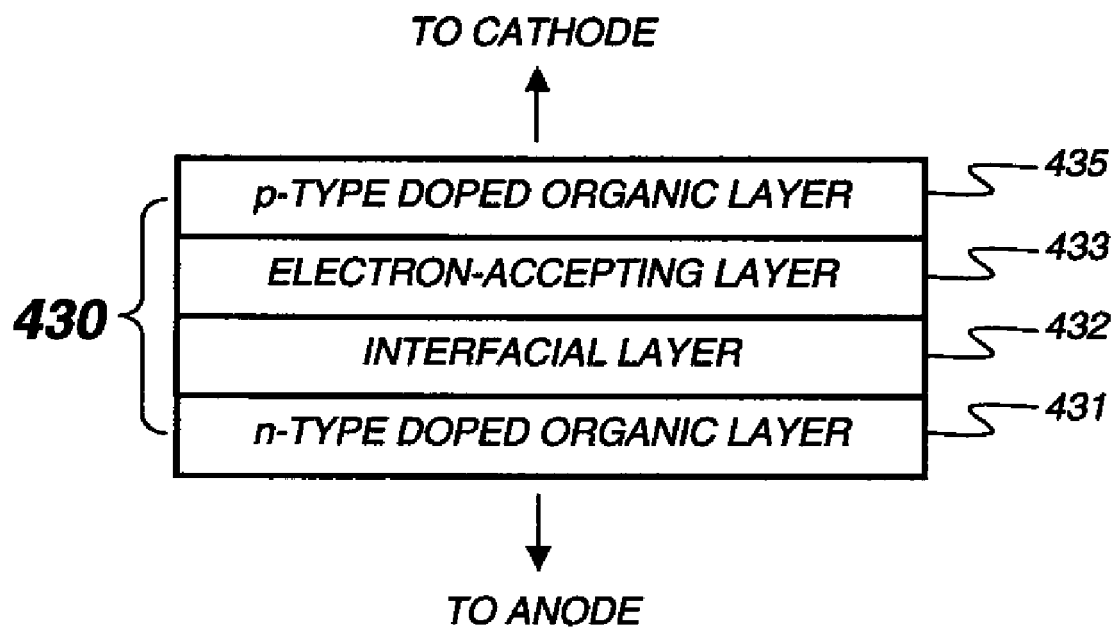
FIG. 4D depicts a schematic cross sectional view of an organic intermediate connector in the tandem OLED in another embodiment of the present invention.

As shown in FIG. 4A, intermediate connector 430 of the present invention has at least two layers including an n-doped organic layer 431 and an electron-accepting layer 433. The electron-accepting layer 433 is disposed closer to the cathode than the n-type doped organic layer 431. These two layers can be in contact, or they can be separated by an interfacial layer 432, as shown in FIG. 4B. The intermediate connector 430 can also have a p-type doped organic layer 435 disposed over the electron-accepting layer 433, as shown in FIG. 4C. The p-type doped organic layer 435 is closer to the cathode than the electron-accepting layer 433. Preferably, the p-type doped organic layer 435 is in contact with the electron-accepting layer 433. The intermediate connector 430 can have both an interfacial layer 432 and a p-type doped organic layer 435 as shown in FIG. 4D.

The n-type doped organic layer contains at least one electron-transporting material as a host material and at least one n-type dopant. The term "n-type doped organic layer" means that this layer has semiconducting properties after doping, and the electrical current through this layer is substantially carried by the electrons. The host material is capable of supporting electron injection and electron transport. The electron-transporting materials defined previously for use in the ETL represent a useful class of host materials for the n-type doped organic layer. Preferred materials are metal chelated oxinoid compounds, including chelates of oxine itself (also commonly referred to as 8-quinolinol or 8-hydroxyquinoline), such as tris(8-hydroxyquinoline)aluminum (Alq). Other materials include various butadiene derivatives as disclosed by Tang in U.S. Pat. No. 4,356,429, various heterocyclic optical brighteners as disclosed by VanSlyke et al. in U.S. Pat. No. 4,539,507, triazines, hydroxyquinoline derivatives, benzazole derivatives, and phenanthroline derivatives. Silole derivatives, such as 2,5-bis(2',2"-bipridin-6-yl)-1,1-dimethyl-3,4-diphenyl silacyclopentadiene are also useful host organic materials. In some instances it is useful to combine two or more hosts to obtain the proper charge injection and stability properties. More specific examples of useful host materials in the n-type organic doped layer include Alq, 4,7-diphenyl-1,10-phenanthroline (Bphen), 2,9-dimethyl-4,7-diphenyl-1,10-phenanthroline (BCP), or 2,2'-[1,1'-biphenyl]-4,4'-diylbis[4,6-(p-tolyl)-1,3,5-triazine] (TRAZ), or combinations thereof.

The n-type dopant in the n-type doped organic layer includes alkali metals, alkali metal compounds, alkaline earth metals, or alkaline earth metal compounds, or combinations thereof. The term "metal compounds" includes organometallic complexes, metal-organic salts, and inorganic salts, oxides and halides. Among the class of metal-containing n-type dopants, Li, Na, K, Rb, Cs, Mg, Ca, Sr, Ba, La, Ce, Sm, Eu, Th, Dy, or Yb, and their compounds, are particularly useful. The materials used as the n-type dopants in the n-type doped organic layer also include organic reducing agents with strong electron-donating properties. By "strong electron-donating properties" it is meant that the organic dopant should be able to donate at least some electronic charge to the host to form a charge-transfer complex with the host. Nonlimiting examples of organic molecules include bis(ethylenedithio)-tetrathiafulvalene (BEDT-TTF), tetrathiafulvalene (TTF), and their derivatives. In the case of polymeric hosts, the dopant can be any of the above or also a material molecularly dispersed or copolymerized with the host as a minor component. Preferably, the n-type dopant in the n-type doped organic layer includes Li, Na, K, Rb, Cs, Mg, Ca, Sr, Ba, La, Ce, Nd, Sm, Eu, Th, Dy, or Yb, or combinations thereof. The n-type doped concentration is preferably in the range of 0.01-20% by volume. The thickness of the n-type doped organic layer is typically less than 200 nm, and preferably less than 100 nm.

The electron-accepting layer 433 of the intermediate connector includes one or more organic materials, each having an electron-accepting property and a reduction potential greater than −0.5 V vs. a Saturated Calomel Electrode (SCE), and wherein the one or more organic materials provide more than 50% by volume in the intermediate connector. Preferably, electron-accepting layer 433 includes one or more organic materials having a reduction potential greater than −0.1 V vs. SCE. More preferably, electron-accepting layer 433 includes a single organic material having an electron-accepting property and a reduction potential greater than −0.1 V vs. SCE. By "electron-accepting property" it is meant that the organic material has the capability or tendency to accept at least some electronic charge from other type of material that it is adjacent.

The term "reduction potential", expressed in volts, measures the affinity of a substance for an electron, the higher the positive number the greater the affinity. Reduction of hydronium ions into hydrogen gas would have a reduction potential of 0.00 V under standard conditions. The reduction potential of a substance can be conveniently obtained by cyclic voltammetry (CV) and it is measured vs. SCE. The measurement of the reduction potential of a substance can be as following: A Model CH1660 electrochemical analyzer (CH Instruments, Inc., Austin, Tex.) is employed to carry out the electrochemical measurements. Both CV and Osteryoung square-wave voltammetry (SWV) can be used to characterize the redox properties of the substance. A glassy carbon (GC) disk electrode (A=0.071 $cm^2$) is used as working electrode. The GC electrode is polished with 0.05 µm alumina slurry, followed by sonication cleaning in deionized water twice and rinsed with acetone in between water cleaning. The electrode is finally cleaned and activated by electrochemical treatment prior to use. A platinum wire can be used as the counter electrode and the SCE is used as a quasi-reference electrode to complete a standard 3-electrode electrochemical cell. A mixture of acetonitrile and toluene (1:1 MeCN/toluene) or methylene chloride ($MeCl_2$) can be used as organic solvent systems. All solvents used are ultra low water grade (<10 ppm water). The supporting electrolyte, tetrabutylammonium tetrafluoroborate (TBAF) is recrystallized twice in isopropanol and dried under vacuum for three days. Ferrocene (Fc) can be used as an internal standard ($E^{red}_{Fc}$=0.50 V vs. SCE in 1:1 MeCN/toluene, $E^{red}_{Fc}$=0.55 V vs. SCE in $MeCl_2$, 0.1 M TBAF). The testing solution is purged with high purity nitrogen gas for approximately 15 minutes to remove oxygen and a nitrogen blanket is kept on the top of the solution during the course of the experiments. All measurements are performed at ambient temperature of 25±1° C. If the compound of interest has insufficient solubility, other solvents can be selected and used by those skilled in the art. Alternatively, if a suitable solvent system cannot be identified, the electron-accepting material can be deposited onto the electrode and the reduction potential of the modified electrode can be measured.

The electron-accepting layer, including one or more organic materials having a reduction potential greater than −0.5 V vs. SCE and providing more than 50% by volume in the electron-accepting layer, can have both effective carrier injection and effective optical transparency in the tandem OLED. Organic materials suitable for use in the electron-accepting layer include not only simple compounds containing at least carbon and hydrogen, but also include metal complexes, e.g., transition metal complexes having organic ligands and organometallic compounds, as long as their reduction potentials are more positive than −0.5 V vs. SCE. Organic materials for the electron-accepting layer can include small molecules (capable of being deposited by vapor deposition), polymers, dendrimers, or combinations. It is also important that at least a portion of the electron-accepting layer does not significantly mix with adjacent layers. This can be accomplished by choosing materials having molecular weight high enough to prevent such diffusion. Preferably, the molecular weight of the electron-accepting material is greater than 350. To maintain the proper electron-accepting properties of the layer, it is desirable that the one or more organic materials constitute more than 90% by volume of the electron-accepting layer. For manufacturing simplicity, a single compound can be used for the electron-accepting layer.

Some examples of organic materials having a reduction potential greater than −0.5 V vs. SCE that can be used to form the electron-injecting layer include, but are not limited to, derivatives of hexaazatriphenylene and tetracyanoquinodimethane.

The organic material used in the electron-accepting layer can be a chemical compound of Formula I:

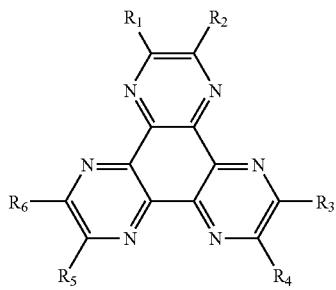

Formula I wherein $R_1$-$R_6$ represent hydrogen or a substituent independently selected from the group including halo, nitrile (—CN), nitro (—$NO_2$), sulfonyl (—$SO_2R$), sulfoxide (—SOR), trifluoromethyl (—$CF_3$), ester (—CO—OR), amide (—CO—NHR or —CO—NRR'), substituted or unsubstituted aryl, substituted or unsubstituted heteroaryl, and substituted or unsubstituted alkyl, where R and R' include substituted or unsubstituted alkyl or aryl; or wherein $R_1$ and $R_2$, $R_3$, and $R_4$, or $R_5$ and $R_6$, combine form a ring structure including an aromatic ring, a heteroaromatic ring, or a nonaromatic ring, and each ring is substituted or unsubstituted.

Materials included within the definition of include small molecules, dendimers, and polymers. When polymeric, for example, the hexaazatriphenylene unit can be a pendant group attached to a polymeric backbone, or can be part of a polymeric backbone. The preparation of the compounds has been disclosed by Czarnik et al. in U.S. Pat. No. 4,780,536.

Specifically, the organic material used in the electron-accepting layer can be a chemical compound of Formula Ia:

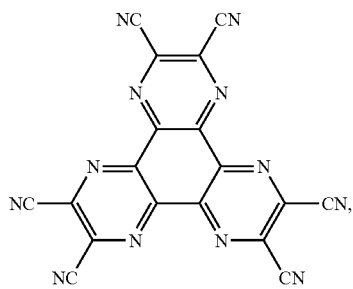

Formula Ia or can be a chemical compound of Formula Ib:

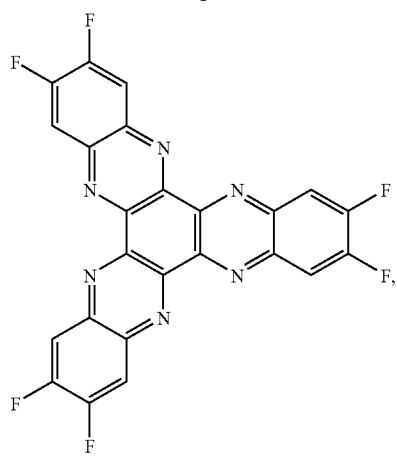

Formula Ib or can be a chemical compound of Formula Ic:

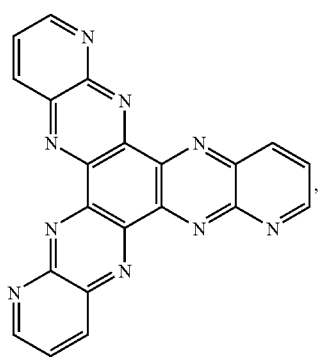

Formula Ic or can be a chemical compound of Formula Id:

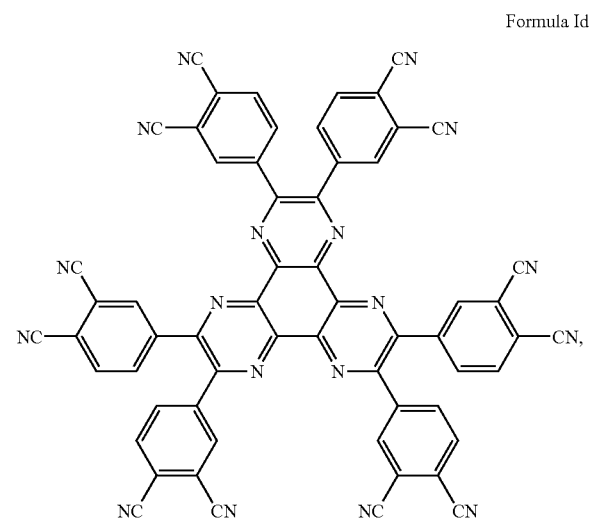

Formula Id or can be a chemical compound of Formula Ie:

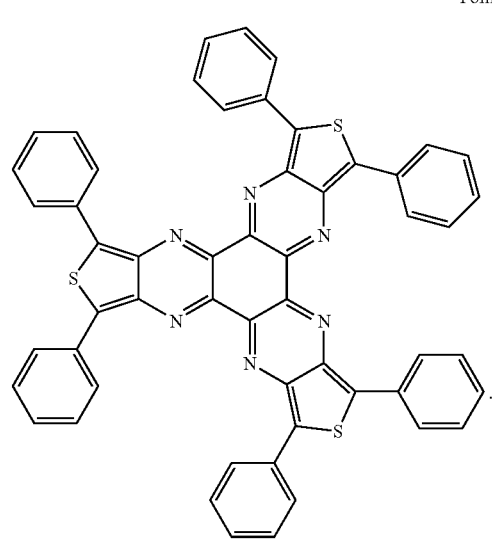

Formula Ie

The organic material used in the electron-accepting layer can also be a chemical compound of Formula II:

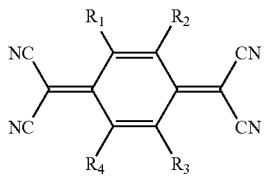

Formula II wherein $R_1$-$R_4$ represent hydrogen or substituents independently selected from the group including nitrile (—CN), nitro (—NO$_2$), sulfonyl (—SO$_2$R), sulfoxide (—SOR), trifluoromethyl (—CF$_3$), ester (—CO—OR), amide (—CO—NHR or —CO—NRR'), substituted or unsubstituted aryl, substituted or unsubstituted heteroaryl, and substituted or unsubstituted alkyl, where R and R' include substituted or unsubstituted alkyl or aryl; or wherein $R_1$ and $R_2$, or $R_3$ and $R_4$, combine to form a ring structure including an aromatic ring, a heteroaromatic ring, or a nonaromatic ring, and each ring is substituted or unsubstituted.

Materials included within the definition of include small molecules, dendimers, and polymers. When polymeric, for example, the tetracyanoquinone unit can be a pendant group attached to a polymeric backbone, or can be part of a polymeric backbone. The preparation of the compounds has been disclosed by Acker et al. in U.S. Pat. No. 3,115,506.

Specifically, the organic material used in the electron-accepting layer can be a chemical compound of Formula IIa:

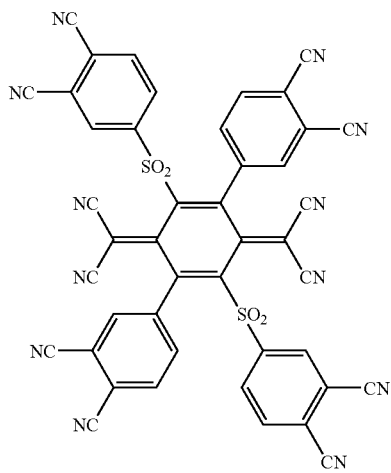

Formula IIa or can be a chemical compound of Formula IIb:

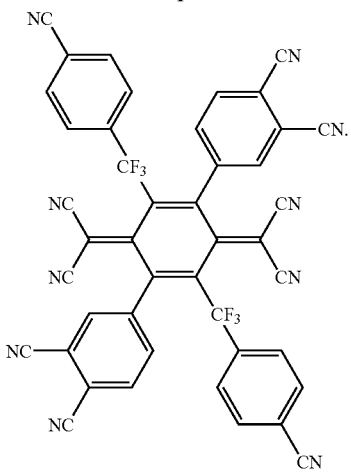

Formula IIb

A useful thickness of the electron-accepting layer is typically between 3 and 100 nm.

The term "p-type doped organic layer" means that the organic layer has semiconducting properties after doping, and the electrical current through this layer is substantially carried by the holes. When used in the present invention, the optional p-type doped organic layer 435 contains at least one organic host material and one p-type dopant, wherein the organic host material is capable of supporting hole transport. The hole-transporting materials used in conventional OLED devices represent a useful class of host materials for the p-type doped organic layer. Preferred materials include aromatic tertiary amines having at least one trivalent nitrogen atom that is bonded only to carbon atoms, at least one of which is a member of an aromatic ring. In one form the aromatic tertiary amine can be an arylamine, such as a mono aryl amine, diaryl amine, triarylamine, or a polymeric arylamine. Other suitable triarylamines substituted with one or more vinyl radicals and/or comprising at least one active hydrogen-containing group are disclosed by Brantley et al. in U.S. Pat. Nos. 3,567,450 and 3,658,520. A more preferred class of aromatic tertiary amines are those which include at least two aromatic tertiary amine moieties as described by VanSlyke et al. in U.S. Pat. Nos. 4,720,432 and 5,061,569. Nonlimiting examples include as N,N'-di(naphthalene-1-yl)-N,N'-diphenyl-benzidine (NPB) and N,N'-diphenyl-N,N'-bis(3-methylphenyl)-1,1-biphenyl-4,4'-diamine (TPD), and N,N,N',N'-tetranaphthyl-benzidine (TNB). Another preferred class of aromatic amines are dihydrophenazine compounds as described in commonly assigned U.S. patent application Ser. No. 10/390,973 filed Mar. 18, 2003 by Kevin P. Klubek et al., entitled "Cascaded Organic Electroluminescent Devices", the disclosure of which is herein incorporated by reference. The combination of the aforementioned materials is also useful to form the p-typed doped organic layer. More preferably, the organic host material in the p-type doped organic layer 435 includes NPB, TPD, TNB, 4,4',4"-tris(N-3-metylphenyl-N-phenyl-amino)-triphenylamine (m-MTDATA), 4,4',4"-tris (N,N-diphenyl-amino)-triphenylamine (TDATA), or dihydrophenazine compounds, or combinations thereof.

The p-type dopant in the p-type doped organic layer 435 includes oxidizing agents with strong electron-withdrawing properties. "Strong electron-withdrawing properties" means that the organic dopant should be able to accept some electronic charge from the host to form a charge-transfer complex with the host material. Some nonlimiting examples include organic compounds such as 2,3,5,6-tetrafluoro-7,7,8,8-tetracyanoquinodimethane ($F_4$-TCNQ) and other derivatives of 7,7,8,8-tetracyanoquinodimethane (TCNQ), and inorganic oxidizing agents such as iodine, $FeCl_3$, $FeF_3$, $SbCl_5$, some other metal chlorides, and some other metal fluorides. The combination of p-type dopants is also useful to form the p-type doped organic layer 435. The p-type doped concentration is preferably in the range of 0.01-20 vol. %. The thickness of the p-type doped organic layer is typically less than 150 nm, and preferably in the range of about 1 to 100 nm.

The host materials used in the intermediate connectors can comprise small molecule materials or polymeric materials, or combinations thereof. In some instances, the same host material can be used for both n-type and p-type doped organic layers, provided that it exhibits both hole and electron transport properties set forth above. Examples of materials that can be used as host for either the n-type or p-type doped organic layers include, but are not limited to, various anthracene derivatives as described in U.S. Pat. No. 5,972,247, certain carbazole derivatives such as 4,4-bis(9-dicarbazolyl)-biphenyl (CBP), and distyrylarylene derivatives such as 4,4'-bis(2, 2'-diphenyl vinyl)-1,1'-biphenyl, and as described in U.S. Pat. No. 5,121,029.

A p-type doped organic layer can form at the interface of the electron-accepting layer and the HTL simply by deposition of the HTL material. In this invention, the materials chosen for the electron-accepting layer and the HTL are such that only a small amount of mixing occurs. That is, it is important that at least some of the electron-accepting layer does not mix with the HTL material.

When used in the present invention, the optional interfacial layer 432 in the intermediate connector 430 is mainly used to stop the possible interdiffusion between materials of the n-typed doped organic layer and the electron-accepting layer. The interfacial layer can be a metal compound or a metal. When used, the layer should be as thin as possible to be effective but reduce optical losses.

The interfacial layer 432 can contain a metal compound selected from the stoichiometric oxides or nonstoichiometric oxides of titanium, zirconium, hafnium, niobium, tantalum, molybdenum, tungsten, manganese, iron, ruthenium, rhodium, iridium, nickel, palladium, platinum, copper, zinc, silicon, or germanium, or combinations thereof. The interfacial layer 432 can contain a metal compound selected from the stoichiometric sulfides or nonstoichiometric sulfides of titanium, zirconium, hafnium, niobium, tantalum, molybdenum, tungsten, manganese, iron, ruthenium, rhodium, iridium, nickel, palladium, platinum, copper, silicon, or germanium, or combinations thereof. The interfacial layer 432 can contain a metal compound selected from the stoichiometric selenides or nonstoichiometric selenides of titanium, zirconium, hafnium, niobium, tantalum, molybdenum, tungsten, manganese, iron, ruthenium, rhodium, iridium, nickel, palladium, platinum, copper, silicon, or germanium, or combinations thereof. The interfacial layer 432 can contain a metal compound selected from the stoichiometric tellurides or non-stoichiometric tellurides of titanium, zirconium, hafnium, niobium, tantalum, molybdenum, tungsten, manganese, iron, ruthenium, rhodium, iridium, nickel, palladium, platinum, copper, silicon, or germanium, or combinations thereof. The interfacial layer 432 can contain a metal compound selected from the stoichiometric nitrides or nonstoichiometric nitrides of titanium, zirconium, hafnium, niobium, tantalum, molybdenum, tungsten, manganese, iron, ruthenium, rhodium, iridium, nickel, palladium, platinum, copper, zinc, gallium, silicon, or germanium, or combinations thereof. The interfacial layer 432 can contain a metal compound selected from the stoichiometric carbides or nonstoichiometric carbides of titanium, zirconium, hafnium, niobium, tantalum, molybdenum, tungsten, manganese, iron, ruthenium, rhodium, iridium, nickel, palladium, platinum, copper, zinc, aluminum, silicon, or germanium, or combinations thereof. Particularly useful metal compounds for use in the interfacial layer 432 can be selected from $MoO_3$, $NiMoO_4$, $CuMoO_4$, $WO_3$, $ZnTe$, $Al_4C_3$, $AlF_3$, $B_2S_3$, $CuS$, $GaP$, $InP$, or $SnTe$. Preferably, the metal compound is selected from $MoO_3$, $NiMoO_4$, $CuMoO_4$, or $WO_3$.

When using a metal compound, the thickness of the interfacial layer 432 in the intermediate connector is in the range of from 0.5 nm to 20 nm.

Alternatively, the interfacial layer 432 can include a high work finction metal layer. The high work fInction metal used to form this layer has a work function no less than 4.0 eV and includes Ti, Zr, Ti, Nb, Ta, Cr, Mo, W, Re, Fe, Ru, Os, Co, Rh, Ir, Ni, Pd, Pt, Cu, Ag, Au, Zn, Al, In, or Sn, or combinations thereof. Preferably, the high work function metal layer includes Ag, Al, Cu, Au, Zn, In, or Sn, or combinations thereof. More preferably, the high work function metal includes Ag or Al.

When using a high work function metal, the thickness of the interfacial layer 432 in the intermediate connector is in the range of from 0.1 nm to 5 nm.

The electrons on the HOMO of the HTL of an EL unit can be readily injected onto the LUMO of its adjacent electron-accepting layer, and then injected onto the LUMO of the n-type doped organic layer adjacent to the electron-accepting layer. The n-type doped organic layer injects electrons into the ETL of the adjacent EL unit, and the electrons next move into the LEL (luminescent zone) where they recombine with holes to emit light, typically at an emissive dopant site in the LEL. Compared to the prior art intermediate connectors, the electrical potential drop (or voltage drop) across the intermediate connector can be reduced and the optical transparency can be increased. Since the intermediate connector is an organic layer, it can be readily formed at a relatively low temperature. Therefore, the organic layer in each of the intermediate connectors can be preferably formed using a thermal evaporation method.

The overall thickness of the intermediate connectors is typically from 5 nm to 200 nm. If there are more than two intermediate connectors in a tandem OLED, the intermediate connectors can be the same or different from each other in terms of layer thickness, material selection, or both.

As mentioned previously, it is often useful to provide a hole-injecting layer (HIL) between the anode and the HTL. The hole-injecting material can serve to improve the film formation property of subsequent organic layers and to facilitate injection of holes into the hole-transporting layer. Suitable materials for use in the hole-injecting layer include, but are not limited to, porphyrinic compounds as described in U.S. Pat. No. 4,720,432, plasma-deposited fluorocarbon polymers as described in U.S. Pat. Nos. 6,127,004, 6,208, 075, and 6,208,077, some aromatic amines, for example, m-MTDATA (4,4',4"-tris[(3-methylphenyl)phenyl-amino] triphenylamine), and inorganic oxides including vanadium oxide (VOx), molybdenum oxide (MoOx), and nickel oxide (NiOx). Alternative hole-injecting materials reportedly useful in organic EL devices are described in EP 0 891 121 A1 and EP 1 029 909 A1. p-Type doped organic materials as described previously for use in the intermediate connector are also a useful class of hole-injecting materials. Hexaazatriphenylene derivatives are also useful HIL materials, as described in U.S. Pat. No. 6,720,573.

It is often useful to provide an electron-injecting layer (EIL) between the cathode and the ETL. n-Type doped organic layers as described previously for use in the intermediate connector are a useful class of electron-injecting materials.

The tandem OLED of the present invention is typically provided over a supporting substrate where either the cathode or anode can be in contact with the substrate. The electrode in contact with the substrate is conveniently referred to as the bottom electrode. Conventionally, the bottom electrode is the anode, but the present invention is not limited to that configuration. The substrate can either be light transmissive or opaque, depending on the intended direction of light emission. The light transmissive property is desirable for viewing the EL emission through the substrate. Transparent glass or plastic is commonly employed in such cases. For applications where the EL emission is viewed through the top electrode, the transmissive characteristic of the bottom support is immaterial, and therefore can be light transmissive, light absorbing, or light reflective. Substrates for use in this case include, but are not limited to, glass, plastic, semiconductor materials, silicon, ceramics, and circuit board materials. Of course, it is necessary to provide in these device configurations a light-transparent top electrode.

When EL emission is viewed through anode 110, the anode should be transparent, or substantially transparent, to the emission of interest. Common transparent anode materials used in the present invention are indium-tin oxide (ITO), indium-zinc oxide (IZO) and tin oxide, but other metal oxides can work including, but not limited to, aluminum- or indium-doped zinc oxide, magnesium-indium oxide, and nickel-tungsten oxide. In addition to these oxides, metal nitrides such as gallium nitride, and metal selenides such as zinc selenide, and metal sulfides such as zinc sulfide, can be used as the anode. For applications where EL emission is viewed only through the cathode electrode, the transmissive characteristics of the anode are immaterial and any conductive material can be used, regardless if it is transparent, opaque, or reflective. Example conductors for this application include, but are not limited to, gold, iridium, molybdenum, palladium, and platinum. Typical anode materials, transmissive or otherwise, have a work function no less than 4.0 eV. Desired anode materials are commonly deposited by any suitable way such as evaporation, sputtering, chemical vapor deposition, or electrochemical means. Anodes can be patterned using well known photolithographic processes. Optionally, anodes can be polished prior to the deposition of other layers to reduce surface roughness so as to reduce electrical shorts or enhance reflectivity.

When light emission is viewed solely through the anode, the cathode 170 used in the present invention can be comprised of nearly any conductive material. Desirable materials have effective film-forming properties to ensure effective contact with the underlying organic layer, promote electron injection at low voltage, and have effective stability. Useful cathode materials often contain a low work function metal (<4.0 eV) or metal alloy. One preferred cathode material is comprised of an MgAg alloy wherein the percentage of silver is in the range of 1 to 20% by atomic ratio, as described in U.S. Pat. No. 4,885,211. Another suitable class of cathode materials includes bilayers comprising a thin inorganic EIL in contact with an organic layer (e.g., organic EIL, or organic ETL), which is capped with a thicker layer of a conductive metal. Here, the inorganic EIL preferably includes a low work function metal or metal salt and, if so, the thicker capping layer does not need to have a low work function. One such cathode is comprised of a thin layer of LiF followed by a thicker layer of Al as described in U.S. Pat. No. 5,677,572. Other useful cathode material sets include, but are not limited to, those disclosed in U.S. Pat. Nos. 5,059,861, 5,059,862, and 6,140,763.

When light emission is viewed through the cathode, the cathode should be transparent or nearly transparent. For such applications, metals should be thin or one should use transparent conductive oxides, or include these materials. Optically transparent cathodes have been described in more detail in U.S. Pat. Nos. 4,885,211, 5,247,190, 5,703,436, 5,608,287, 5,837,391, 5,677,572, 5,776,622, 5,776,623, 5,714,838, 5,969,474, 5,739,545, 5,981,306, 6,137,223, 6,140,763, 6,172,459, 6,278,236, 6,284,393, and EP 1 076 368. Cathode materials are typically deposited by thermal evaporation, electron beam evaporation, ion sputtering, or chemical vapor deposition. When needed, patterning can be achieved through many well known methods including, but not limited to, through-mask deposition, integral shadow masking, for example as described in U.S. Pat. No. 5,276,380 and EP 0 732 868, laser ablation, and selective chemical vapor deposition.

Figure 5:
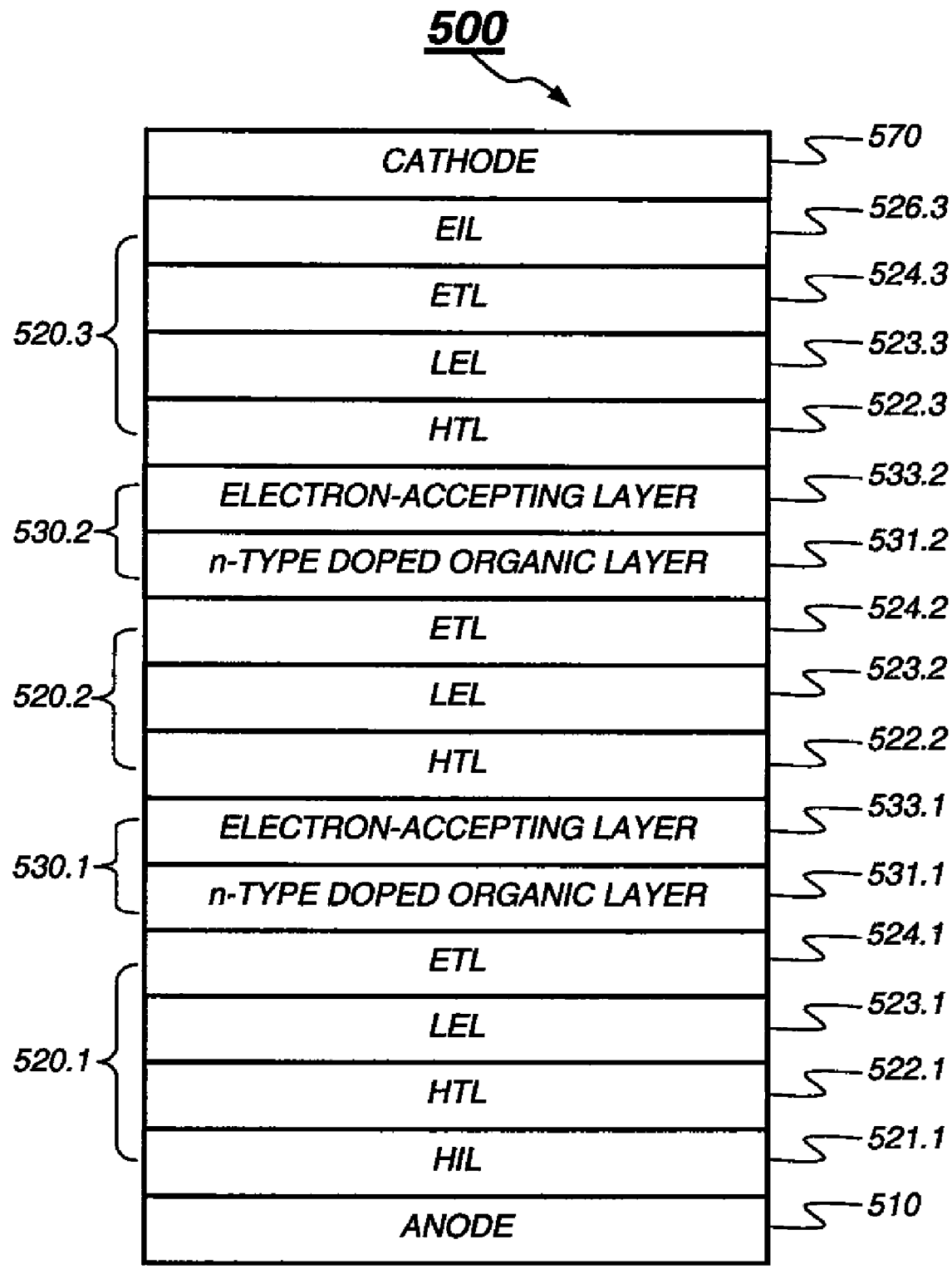
FIG. 5 depicts a schematic cross sectional view of a specific tandem OLED, having three EL units connected in series by two intermediate connector, in accordance with the present invention.

One useful configuration of the tandem OLED of this invention is shown in FIG. 5. Tandem OLED 500 has three organic EL units and two intermediate connectors. In sequence, there is provided an anode 510; a first organic EL unit 520.1 including HIL 521.1, HTL 522.1, LEL 523.1, and ETL 524.1; a first intermediate connector 530.1 including n-type doped organic layer 531.1 and electron-accepting layer 533.1; a second organic EL unit 520.2 including HTL 522.2, LEL 523.2, and ETL 524.2; a second intermediate connector 530.2 including n-type doped organic layer 531.2 and electron-accepting layer 533.2; a third organic EL unit 520.3 including HTL 522.3, LEL 523.3, ETL 524.3, and EIL 526.3; and a cathode 570. For clarity, the power supply and electrical conductors are not shown.

As is apparent from FIG. 5, the n-doped organic layer of an intermediate connector can be adjacent to an ETL of an organic EL unit. In this case, it can be convenient for making the same electron transporting material in both the ETL and in the n-doped organic layer. However, this is not required and the electron transporting materials can be different for each layer.

The organic materials mentioned above are suitably deposited through a vapor-phase method such as sublimation, but can be deposited from a fluid, for example, from a solvent with an optional binder to improve film formation. If the material is a polymer, solvent deposition is useful but other methods can be used, such as sputtering or thermal transfer from a donor sheet. The material to be deposited by sublimation can be vaporized from a sublimation "boat" often comprised of a tantalum material, e.g., as described in U.S. Pat. No. 6,237,529, or can be first coated onto a donor sheet and then sublimed in closer proximity to the substrate. Layers with a mixture of materials can use separate sublimation boats or the materials can be premixed and coated from a single boat or donor sheet. Patterned deposition can be achieved using shadow masks, integral shadow masks (U.S. Pat. No. 5,294,870), spatially-defined thermal dye transfer from a donor sheet (U.S. Pat. Nos. 5,688,551, 5,851,709 and 6,066,357), and inkjet method (U.S. Pat. No. 6,066,357).

Most OLED devices are sensitive to moisture or oxygen, or both, so they are commonly sealed in an inert atmosphere such as nitrogen or argon. In sealing an OLED device in an inert environment, a protective cover can be attached using an organic adhesive, a metal solder, or a low melting temperature glass. Commonly, a getter or desiccant is also provided within the sealed space. Useful getters and desiccants include, alkali and alkaline metals, alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890. In addition, barrier layers such as SiOx, Teflon, and alternating inorganic/polymeric layers are known in the art for encapsulation.

OLED devices of the present invention can employ various well-known optical effects in order to enhance its properties if desired. This includes optimizing layer thicknesses to yield maximum light transmission, providing dielectric mirror structures, replacing reflective electrodes with light-absorbing electrodes, providing anti glare or anti-reflection coatings over the display, providing a polarizing medium over the display, or providing colored, neutral density, or color conversion filters in fimctional relationship with the light-emitting areas of the display. Filters, polarizers, and anti-glare or anti-reflection coatings can also be provided over a cover or as part of a cover.

White or broadband emission can be combined with color filters to provide full color or multicolor display. The color filters can include red, green, and blue filters. There can also be provided a color system that includes red, green, blue and white filters can be used, e.g., as described in U.S. Patent Application Publication 2004/0113875 A1. In place of white, yellow or cyan can be used. Five or more color systems can also be useful.

The OLED device can have a microcavity structure. In one useful example, one of the metallic electrodes is essentially opaque and reflective; the other one is reflective and semitransparent. The reflective electrode is preferably selected from Au, Ag, Mg, Ca, or alloys thereof. Because of the presence of the two reflecting metal electrodes, the device has a microcavity structure. The strong optical interference in this structure results in a resonance condition. Emission near the resonance wavelength is enhanced and emission away from the resonance wavelength is depressed. The optical path length can be tuned by selecting the thickness of the organic layers or by placing a transparent optical spacer between the electrodes. For example, an OLED device of this invention can have ITO spacer layer placed between a reflective anode and the organic EL media, with a semitransparent cathode over the organic EL media.

The present invention can be employed in most OLED device configurations. These include very simple structures comprising a single anode and cathode to more complex devices, such as area color displays, passive matrix displays comprised of orthogonal arrays of anodes and cathodes to form pixels, and active-matrix displays where each pixel is controlled independently, for example, with thin film transistors (TFTs). The invention can also be employed for devices where the OLED is used as a lights source, for example, in solid-state lighting or backlights for LCD displays.

EXAMPLES

The following examples are presented for a further understanding of the present invention. In the following examples, the thickness of the organic layers and the doping concentrations were controlled and measured in situ using calibrated thickness monitors (INFICON IC/5 Deposition Controller). The EL characteristics of all the fabricated devices were evaluated using a constant current source (KEITHLEY 2400 SourceMeter) and a photometer (PHOTO RESEARCH SpectraScan PR 650) at room temperature. The color will be reported using Commission Internationale de l'Eclairage (CIE) coordinates.

Example 1

Comparative

The preparation of a conventional OLED is as follows:

A ~1.1 mm thick glass substrate coated with a transparent indium-tin-oxide (ITO) conductive layer was cleaned and dried using a commercial glass scrubber tool. The thickness of ITO is about 42 nm and the sheet resistance of the ITO is about 68 Ω/square. The ITO surface was subsequently treated with oxidative plasma to condition the surface as an anode. A layer of CFx, 1 nm thick, was deposited on the clean ITO surface as the hole-injecting layer by decomposing $CHF_3$ gas in an RF plasma treatment chamber. The substrate was then transferred into a vacuum deposition chamber for deposition of all other layers on top of the substrate. The following layers were deposited in the following sequence by evaporation from a heated boat under a vacuum of approximately $10^{-6}$ Torr:

1. EL Unit:
   a) an HTL, 100 nm thick, including "4,4'-bis[N-(l-naphthyl)-N-phenylamino]biphenyl" (NPB);
   b) a LEL, 20 nm thick, including "tris(8-hydroxyquinoline)-aluminum" (Alq) doped with 1.0 vol % 10-(2-benzothiazolyl)-1,1,7,7-tetramethyl-2,3,6,7-tetrahydro-1H,5H,11H(1)benzopyrano(6,7,8-ij)quinolizin-11-one (C545T); and
   c) an ETL, 40 nm thick, including Alq.
2. Cathode: approximately 210 nm thick, including MgAg (formed by coevaporation of about 95 vol. % Mg and 5 vol. % Ag).

After the deposition of these layers, the device was transferred from the deposition chamber into a dry box (VAC Vacuum Atmosphere Company) for encapsulation. The OLED has an emission area of 10 $mm^2$.

This conventional OLED requires a drive voltage of about 6.8 V to pass 20 $mA/cm^2$. Under this test condition, the device has a luminance of 2164 $cd/m^2$, and a luminous efficiency of about 10.8 cd/A. Its CIEx and CIEy are 0.284, 0.653, respectively, with an emission peak at 520 nm. The EL performance data are summarized in Table 1.

Example 2

Comparative

A tandem OLED was constructed with the similar fabrication methods to those used in Example 1, and the deposited layer structure is:
1. $1^{st}$ EL Unit:
   The $1^{st}$ EL unit is the same as the EL unit in Example 1.
2. $2^{nd}$ EL Unit:
   The $2^{nd}$ EL unit is the same as the EL unit in Example 1 except that the thickness of the HTL (NPB layer) is changed from 100 nm to 85 nm.
3. Cathode: approximately 210 nm thick, including MgAg.

This tandem OLED requires a drive voltage of about 38.5 V to pass 20 $mA/cm^2$. Under this test condition, the device has a luminance of 1410 $cd/m^2$, and a luminous efficiency of about 7.1 cd/A. Its CIEx and CIEy are 0.282, 0.660, respectively, with an emission peak at 524 nm. The EL performance data are summarized in Table 1.

Since there is no intermediate connector between the two EL units, the EL performance of the tandem OLED is very poor requiring a drive voltage 5 times as high as that of the conventional OLED while emitting less than 70% of the light emitted from the conventional OLED. This example implies that the intermediate connector connecting the EL units in a tandem OLED plays an important role in order to achieve high luminous efficiency in a tandem device.

Example 3

Comparative

Another tandem OLED was constructed with the similar fabrication methods to those used in Example 1, and the deposited layer structure is:
1. $1^{st}$ EL Unit:
   The $1^{st}$ EL unit is the same as the EL unit in Example 1.
2. $1^{st}$ Intermediate Connector:
   a metal layer, 10 nm thick, including Ag.
3. $2^{nd}$ EL Unit:
   The $2^{nd}$ EL unit is the same as the EL unit in Example 1 except that the thickness of the HTL (NPB layer) is changed from 100 nm to 75 nm.

4. Cathode: approximately 210 nm thick, including MgAg.

This tandem OLED requires a drive voltage of about 28.7 V to pass 20 mA/cm². Under this test condition, the device has a luminance of 183 cd/m², and a luminous efficiency of about 0.9 cd/A. Its CIEx and CIEy are 0.288, 0.654, respectively, with an emission peak at 524 nm. The EL performance data are summarized in Table 1.

Although there is an Ag layer as an intermediate connector between the two EL units, this intermediate connector is not able to inject electrons into the LUMO of the ETL of the $1^{st}$ EL unit in contact with the anode. As a result, the EL performance of the tandem OLED is very poor requiring a drive voltage 4 times as high as that of the conventional OLED while emitting less than 10% of the light emitted from the conventional OLED. This example also implies that the intermediate connector connecting the EL units in a tandem OLED plays an important role in order to achieve high luminous efficiency in a tandem device.

Example 4

Comparative

Another tandem OLED was constructed with the similar fabrication methods to those used in Example 1, and the deposited layer structure is:
1. $1^{st}$ EL Unit:
   a) an HTL, 100 nm thick, including NPB;
   b) a LEL, 20 nm thick, including Alq doped with 1.0 vol % C545T;
   c) an ETL, 10 nm thick, including Alq;
2. $1^{st}$ Intermediate Connector:
   d) an n-type doped organic layer, 30 nm thick, including Alq doped with 1.2 vol % lithium;
   e) a p-type doped organic layer, 65 rm thick, including NPB doped with 4 vol % 2,3,5,6-tetrafluoro-7,7,8,8-tetracyanoquinodimethane ($F_4$-TCNQ);
3. $2^{nd}$ EL Unit:
   f) an HTL, 20 nm thick, including NPB;
   g) a LEL, 20 nm thick, including Alq doped with 1.0 vol % C545T; and
   h) an ETL, 40 nm thick, including Alq.
4. Cathode: approximately 210 nm thick, including MgAg.

This tandem OLED requires a drive voltage of about 15.9 V to pass 20 mA/cm². Under this test condition, the device has a luminance of 4690 cd/m², and a luminous efficiency of about 23.5 cd/A. Its CIEx and CIEy are 0.290, 0.659, respectively, with an emission peak at 524 nm. The EL performance data are summarized in Table 1.

The two EL units in this tandem OLED are the same as the EL unit in Example 1. Comparing to the device in Example 1, both the drive voltage and the luminous efficiency of this tandem OLED in Example 4 are more than double of those of the device in Example 1. Since the drive voltage of the device in Example 1 is about 6.8 V under the test condition of 20 mA/cm², the drive voltage of the device in Example 2 should be about 6.8×2=13.6 V under the test condition of 20 mA/cm² if there were no voltage drop across the organic intermediate connector. However, there are extra 2.3 V across the device, which can indicate that this organic intermediate connector does not have optimal carrier injection capability. Therefore, even though the tandem device of Example 4 is improved over Examples 2 and 3, there is still opportunity for further improvement. Moreover, the p-type doped organic layer is formed using two evaporation sources, which increase manufacturing complexity.

Shown in Table 1 is the summary of the EL performance of Examples 1-4 discussed above.

TABLE 1

| Example (Type) (EL measured at 20 mA/cm²) | Voltage (V) | Luminance (cd/m²) | Luminous Efficiency (cd/A) | CIE x (1931) | CIE y (1931) | Peak (nm) |
|---|---|---|---|---|---|---|
| 1 (Comparative) | 6.8 | 2164 | 10.8 | 0.284 | 0.653 | 520 |
| 2 (Comparative) | 38.5 | 1410 | 7.1 | 0.282 | 0.660 | 524 |
| 3 (Comparative) | 28.7 | 183 | 0.9 | 0.288 | 0.654 | 524 |
| 4 (Comparative) | 15.9 | 4690 | 23.5 | 0.290 | 0.659 | 524 |

Example 5

Comparative

Another conventional OLED was constructed with the similar fabrication methods to those used in Example 1, and the deposited layer structure is:
1. EL Unit:
   a) an HTL, 90 nm thick, including NPB;
   b) a LEL, 30 nm thick, including Alq doped with 1.0 vol % C545T; and
   c) an EIL, 30 nm thick, including Alq doped with 1.2 vol % lithium.
2. Cathode: approximately 210 nm thick, including MgAg.

Figure 6:
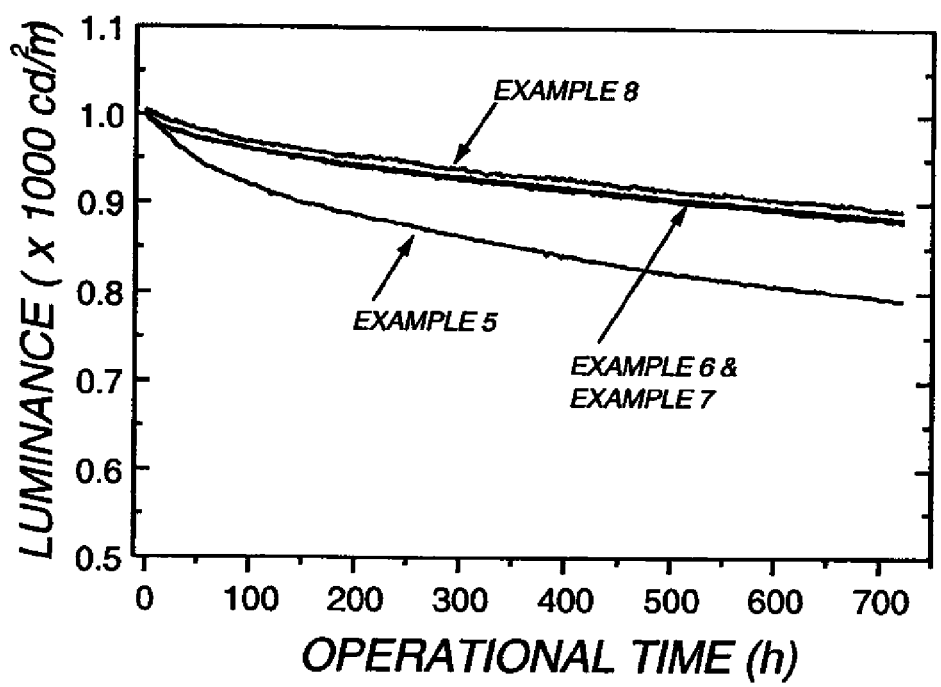
FIG. 6 is a graph showing the luminance vs. operational time tested at an initial luminance of 1000 cd/m$^2$ and at room temperature.
Figure 7:
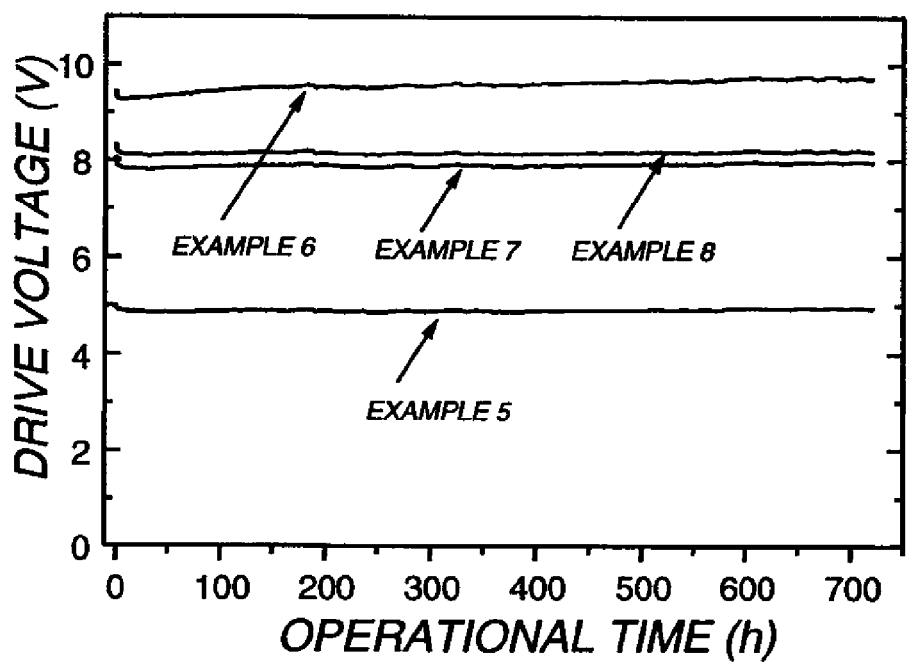
FIG. 7 is a graph showing the drive voltage vs. operational time tested at an initial luminance of 1000 cd/m$^2$ and at room temperature.

This conventional OLED requires a drive voltage of about 5.3 V to pass 20 mA/cm². Under this test condition, the device has a luminance of 2011 cd/m², and a luminous efficiency of about 10.1 cd/A. Its CIEx and CIEy are 0.285, 0.653, respectively, with an emission peak at 522 nm. The EL performance data are summarized in Table 2. Its luminance vs. operational time and its drive voltage vs. operational time, tested at an initial luminance of 1000 cd/m² and at room temperature, are shown in FIGS. 6 and 7, respectively.

Example 6

Comparative

Another tandem OLED was constructed with the similar fabrication methods to those used in Example 1, and the deposited layer structure is:
1. $1^{st}$ EL Unit:
   a) an HTL, 90 nm thick, including NPB;
   b) a LEL, 30 nm thick, including Alq doped with 1.0 vol % C545T;
2. $1^{st}$ Intermediate Connector:
   c) n-type doped organic layer, 30 nm thick, including Alq doped with 1.2 vol % lithium; and
   d) a metal compound layer, 2 nm thick, including $WO_3$.
3. $2^{nd}$ EL Unit:
   The $2^{nd}$ EL unit is the same as the EL unit in Example 5 except that the thickness of the HTL (NPB layer) is changed from 90 nm to 80 nm.
4. Cathode: approximately 210 nm thick, including MgAg.

This tandem OLED requires a drive voltage of about 11.9 V to pass 20 mA/cm². Under this test condition, the device has a luminance of 4268 cd/m , and a luminous efficiency of about 21.3 cd/A. Its CIEx and CIEy are 0.268, 0.666, respectively, with an emission peak at 522 nm. The EL performance data are summarized in Table 2. Its luminance vs. operational time and its drive voltage vs. operational time, tested at an initial luminance of 1000 cd/m² and at room temperature, are shown in FIGS. 6 and 7, respectively.

The two EL units in this tandem OLED are connected by an intermediate connector including a 30 nm n-type doped organic layer and a 2 nm thick layer of $WO_3$. Comparing to the device in Example 1, both the drive voltage and the luminous efficiency of this tandem OLED in Example 6 are double of those of the device in Example 5. This indicates that $WO_3$ has formed an effective intermediate connector in the tandem OLED. However, the thermal evaporation temperature of $WO_3$ is as high as 1000° C. causing difficulty for manufacturing.

Example 7

Inventive

Another tandem OLED according to the present invention was constructed with the similar fabrication methods to those used in Example 1, and the deposited layer structure is:
1. 1$^{st}$ EL Unit:
   a) an HTL, 90 nm thick, including NPB;
   b) a LEL, 30 nm thick, including Alq doped with 1.0 vol % C545T;
2. 1$^{st}$ Intermediate Connector:
   c) n-type doped organic layer, 30 nm thick, including Alq doped with 1.2 vol % lithium; and
   d) an electron-accepting layer, 10 nm thick, including the hexaazatriphenylene derivative, Formula Ia.
3. 2$^{nd}$ EL Unit:
   The 2$^{nd}$ EL unit is the same as the EL unit in Example 5 except that the thickness of the HTL (NPB layer) is changed from 90 nm to 80 nm.
4. Cathode: approximately 210 nm thick, including MgAg.

This tandem OLED requires a drive voltage of about 10.3 V to pass 20 mA/cm². Under this test condition, the device has a luminance of 4284 cd/m², and a luminous efficiency of about 21.4 cd/A. Its CIEx and CIEy are 0.269, 0.667, respectively, with an emission peak at 522 nm. The EL performance data are summarized in Table 2. Its luminance vs. operational time and its drive voltage vs. operational time, tested at an initial luminance of 1000 cd/m² and at room temperature, are shown in FIGS. 6 and 7, respectively.

The two EL units in this tandem OLED are connected by an intermediate connector having a 30 nm thick n-type doped organic layer and a 10 nm thick electron-accepting layer. The hexaazatriphenylene derivative used in the electron-accepting layer has a reduction potential of −0.08 V vs. SCE, which is greater than −0.5 V. Comparing to the device in Example 6, this tandem OLED in Example 7 has the same luminous efficiency and lower drive voltage. The luminance decrease vs. the operational time in this tandem OLED shown in FIG. 6 is similar to that of the device in Example 6. However, the voltage rise vs. the operational time in this tandem OLED shown in FIG. 7 is less than 0.2 V after 700 hour's operation, which is less than that of the device in Example 6 (its voltage rise is 0.5 V after 700 hour's operation). In addition, the evaporation of this organic material is much easier than that of $WO_3$ and will not cause any difficulty for manufacturing.

Example 8

Another tandem OLED according to the present invention was constructed with the similar fabrication methods to those used in Example 1, and the deposited layer structure is:
1. 1$^{st}$ EL Unit:
   a) an HTL, 90 nm thick, including NPB;
   b) a LEL, 30 nm thick, including Alq doped with 1.0 vol % C545T;
2. 1$^{st}$ Intermediate Connector:
   c) n-type doped organic layer, 30 nm thick, including Alq doped with 1.2 vol % lithium; and
   d) an electron-accepting layer, 5 nm thick, including the hexaazatriphenylene derivative, Formula Ia.
3. 2$^{nd}$ EL Unit:
   The 2$^{nd}$ EL unit is the same as the EL unit in Example 5 except that the thickness of the HTL (NPB layer) is changed from 90 nm to 85 nm.
4. Cathode: approximately 210 nm thick, including MgAg.

This tandem OLED requires a drive voltage of about 11.0 V to pass 20 mA/cm². Under this test condition, the device has a luminance of 4524 cd/m², and a luminous efficiency of about 22.6 cd/A. Its CIEx and CIEy are 0.268, 0.668, respectively, with an emission peak at 522 nm. The EL performance data are summarized in Table 2. Its luminance vs. operational time and its drive voltage vs. operational time, tested at an initial luminance of 1000 cd/m² and at room temperature, are shown in FIGS. 6 and 7, respectively.

The two EL units in this tandem OLED are connected by an intermediate connector having a 30 nm n-type doped organic layer and a 5 nm thick electron-accepting layer. The hexaazaphenylene derivative used in the electron-accepting layer has a reduction potential higher than −0.5 V vs. SCE. Comparing to the device in Example 6, this tandem OLED in Example 8 has higher luminous efficiency and lower drive voltage. The luminance decrease vs. operational time in this tandem OLED shown in FIG. 6 is similar to that of the device in Example 6. However, the voltage rise vs. the operational time in this tandem OLED shown in FIG. 7 is less than 0.2 V after 700 hour's operation, which is less than that of the device in Example 6 (its voltage rise is 0.5 V after 700 hour's operation). Of course, the evaporation of this organic material is much easier than that of $WO_3$ and will not cause any difficulty for manufacturing.

Shown in Table 2 is the summary of the EL performance of Examples 5-8 discussed above.

TABLE 2

| Example (Type) (EL measured at 20 mA/cm²) | Voltage (V) | Luminance (cd/m²) | Luminous Efficiency (cd/A) | CIE x (1931) | CIE y (1931) | Peak (nm) |
|---|---|---|---|---|---|---|
| 5 (Comparative) | 5.3 | 2011 | 10.1 | 0.285 | 0.653 | 522 |
| 6 (Comparative) | 11.9 | 4268 | 21.3 | 0.268 | 0.666 | 522 |
| 7 | 10.3 | 4284 | 21.4 | 0.269 | 0.667 | 522 |
| 8 | 11.0 | 4524 | 22.6 | 0.268 | 0.668 | 522 |

Example 9

Comparative

Another conventional OLED was constructed with similar fabrication methods to those used in Example 1, and the deposited layer structure is:
1. EL Unit:
   a) an HTL, 75 nm thick, including NPB;
   b) a LEL, 20 nm thick, including Alq; and
   c) an ETL, 40 nm thick, including Alq.
2. Cathode: approximately 205 nm thick, including MgAg.

This conventional OLED requires a drive voltage of about 6.8 V to pass 20 mA/cm². Under this test condition, the device has a luminance of 516 cd/m², and a luminous efficiency of about 2.6 cd/A. Its emission peak is at 524 nm. The operational stability was measured as $T_{90}$ (20° C.@20 mA/cm²) (i.e. a time at which the luminance retains 90% of its initial value after being operated at 20° C. and at 20 mA/cm 2). Its $T_{90}$(20° C.@20 mA/cm²) is about 300 hours. The EL performance data are summarized in Table 3.

Example 10

Comparative

Another tandem OLED was constructed with the similar fabrication methods to those used in Example 1, and the deposited layer structure is:
1. $1^{st}$ EL Unit:
   a) an HTL, 75 nm thick, including NPB;
   b) a LEL, 20 nm thick, including Alq;
   c) an ETL, 5 nm thick, including Alq;
2. $1^{st}$ Intermediate Connector:
   d) an n-type doped organic layer, 4 nm thick, including Alq doped with 1.5 vol % lithium;
   e) a pure $F_4$-TCNQ layer with a thickness of 1 nm.
3. $2^{nd}$ EL Unit:
   f) an HTL, 20 nm thick, including NPB;
   g) a LEL, 20 nm thick, including Alq; and
   h) an ETL, 40 nm thick, including Alq.
4. Cathode: approximately 205 nm thick, including MgAg.

This tandem OLED requires a drive voltage of about 11.9 V to pass 20 mA/cm². Under this test condition, the device has a luminance of 853 cd/m², and a luminous efficiency of about 4.3 cd/A. Its emission peak is at 536 nm. The operational stability was measured as $T_{90}$(20° C.@20 mA/cm²), which is about 50 hours. The EL performance data are summarized in Table 3.

Example 10 indicated that although $F_4$-TCNQ has a reduction potential greater than −0.5 V vs. SCE (the reduction potential of $F_4$-TCNQ was measured to be about 0.64 V vs. SCE in the 1:1 MeCN/toluene organic solvent system), it is not suitable for use as a pure layer or majority component in the electron-accepting layer due to its very small molecular size. Such small molecules often have undesirable film formation properties and are highly diffusive as indicated by Gao et al, in *Applied Physics Letters*, 79, 4040 (2001). When NPB is deposited over $F_4$-TCNQ, it is believed that a pure electron-accepting film of $F_4$-TCNQ is not maintained. The resulting OLED device has very poor operational stability. Useful materials for the electron-accepting layer preferably have a molecular weight of greater than 350.

TABLE 3

| Example (Type) (EL measured at 20 mA/cm²) | Voltage (V) | Luminance (cd/m²) | Luminous Efficiency (cd/A) | Peak (nm) | $T_{90}$(20° C. @ 20 mA/cm²) (Hrs) |
|---|---|---|---|---|---|
| 9 (Comparative) | 6.8 | 516 | 2.6 | 524 | 300 |
| 10 (Comparative) | 11.9 | 853 | 4.3 | 536 | ~50 |

The invention has been described in detail with particular reference to certain preferred embodiments thereof, but it will be understood that variations and modifications can be effected within the spirit and scope of the invention.

PARTS LIST

| | |
|---|---|
| 100 | tandem OLED |
| 110 | anode |
| 120.1 | first EL unit |
| 120.2 | second EL unit |
| 120.3 | third EL unit |
| 120.(N − 1) | (N − 1)$^{th}$ EL unit |
| 120.N | N$^{th}$ EL unit |
| 130.1 | first intermediate connector |
| 130.2 | second intermediate connector |
| 130.(N − 1) | (N − 1)$^{th}$ intermediate connector |
| 170 | cathode |
| 180 | voltage/current source |
| 190 | electrical conductors |
| 200 | tandem OLED having three EL units |
| 320 | EL unit |
| 322 | hole-transporting layer (or HTL) |
| 323 | light-emitting layer (or LEL) |
| 324 | electron-transporting layer (or ETL) |
| 430 | intermediate connector |
| 431 | n-type doped organic layer |
| 432 | interfacial layer |
| 433 | electron-accepting layer |
| 435 | p-type doped organic layer |
| 500 | tandem OLED |
| 510 | anode |
| 520.1 | first EL unit |
| 520.2 | second EL unit |
| 520.3 | third EL unit |
| 521.1 | HIL of the 1$^{st}$ EL unit |
| 522.1 | HTL of the 1$^{st}$ EL unit |
| 522.2 | HTL of the 2$^{nd}$ EL unit |
| 522.3 | HTL of the 3$^{rd}$ EL unit |
| 523.1 | LEL of the 1$^{st}$ EL unit |
| 523.2 | LEL of the 2$^{nd}$ EL unit |
| 523.3 | LEL of the 3$^{rd}$ EL unit |
| 524.1 | ETL of the 1$^{st}$ EL unit |
| 524.2 | ETL of the 2$^{nd}$ EL unit |
| 524.3 | ETL of the 3$^{rd}$ EL unit |
| 530.1 | first intermediate connector |
| 530.2 | second intermediate connector |
| 531.1 | n-type doped organic layer of the 1$^{st}$ intermediate connector |
| 531.2 | n-type doped organic layer of the 2$^{nd}$ intermediate connector |
| 533.1 | electron-accepting layer of the 1$^{st}$ intermediate connector |
| 533.2 | electron-accepting layer of the 2$^{nd}$ intermediate connector |
| 526.3 | EIL of the 3$^{rd}$ EL unit |
| 570 | cathode |

The invention claimed is:

1. A tandem OLED comprising:

a) an anode;

b) a cathode;

c) at least two electroluminescent units disposed between the anode and the cathode, wherein each of the electroluminescent units includes at least one hole-transporting layer and one organic light-emitting layer;

d) an intermediate connector disposed between adjacent electroluminescent units, wherein the intermediate connector includes an n-doped organic layer and an electron-accepting layer being disposed closer to the cathode than the n-doped organic layer, wherein the electron-accepting layer has a thickness range of from 3 nm to 100 nm and having one organic material having a molecular weight greater than 350, and having a reduction potential greater than −0.5 V vs. a Saturated Calomel Electrode, and wherein the n-doped organic layer is in direct contact with the electron-accepting layer; and e) the material in the electron-accepting layer consists of a chemical compound of the following formula:

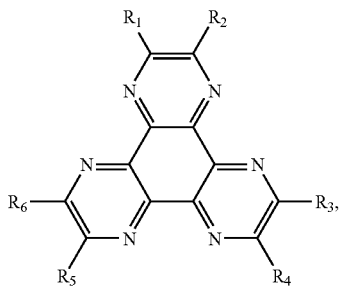

wherein $R_1$-$R_6$ represent hydrogen or a substituent independently selected from the group including halo, nitrile (—CN), nitro (—NO$_2$), sulfonyl (—SO$_2$R), sulfoxide (—SOR), trifluoromethyl (—CF$_3$), ester (—CO—OR), amide (—CO—NHR or —CO—NRR'), substituted or unsubstituted aryl, substituted or unsubstituted heteroaryl, and substituted or unsubstituted alkyl, where R and R' include substituted or unsubstituted alkyl or aryl; or wherein $R_1$ and $R_2$, $R_3$ and $R_4$, or $R_5$, and $R_6$ combine form a ring structure including an aromatic ring, a heteroaromatic ring, or a nonaromatic ring, and each ring is substituted or unsubstituted.

2. The tandem OLED of claim 1 wherein the organic material has a reduction potential greater than −0.1 V vs. a Saturated Calomel Electrode.

3. The tandem OLED of claim 1 wherein there are three electroluminescent units and two intermediate connectors, each intermediate connector disposed between adjacent electroluminescent units.

4. The tandem OLED of claim 1 wherein the organic material in the electron-accepting layer consists of

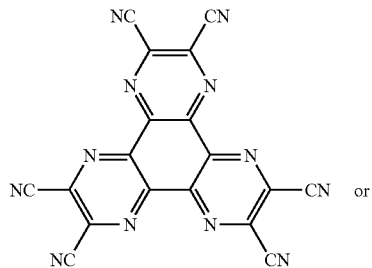 or

-continued

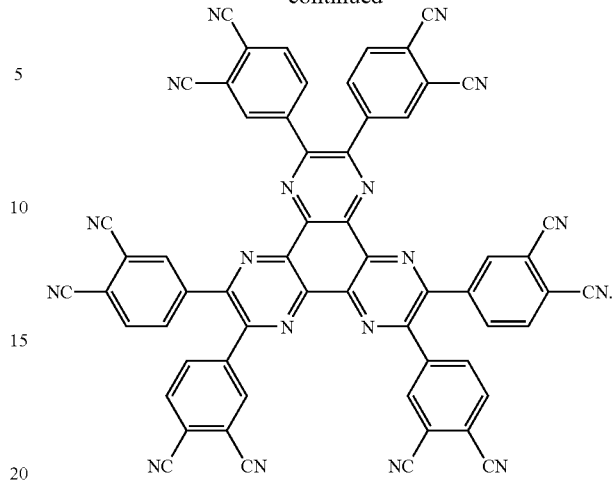

5. The tandem OLED of claim 1 wherein the electroluminescent units individually emit red, green, blue, or white light.

6. The tandem OLED of claim 1 wherein the n-type doped organic layer contains one electron-transporting material and at least one n-type dopant.

7. The tandem OLED of claim 6 wherein the electron-transporting material includes metal chelated oxinoid compounds, butadiene derivatives, heterocyclic optical brighteners, triazines, hydroxyquinoline derivatives, benzazole derivatives, phenanthroline derivatives, or silole derivatives, or combinations thereof.

8. The tandem OLED of claim 6 wherein the electron-transporting material includes tris(8-hydroxyquinoline)aluminum (Alq), 4,7-diphenyl-1,10-phenanthroline (Bphen), 2,9-dimethyl-4,7-diphenyl-1,10-phenanthroline (BCP), or 2,2'-[1,1'-biphenyl]-4,4'-diylbis[4,6-(p-tolyl)-1,3,5-triazine] (TRAZ), or combinations thereof.

9. The tandem OLED of claim 6 wherein the n-type dopant includes alkali metals, alkali metal compounds, alkaline earth metals, alkaline earth metal compounds, or rare earth metal, or combinations thereof.

10. The tandem OLED of claim 6 wherein the n-type dopant includes Li, Na, K, Rb, Cs, Mg, Ca, Sr, Ba, La, Ce, Nd, Sm, Eu, Tb, Dy, or Yb, or combinations thereof.

11. An OLED solid-state lighting source comprising the tandem OLED of claim 1.

* * * * *